United States Patent
Ohmer et al.

(10) Patent No.: US 6,508,960 B1
(45) Date of Patent: Jan. 21, 2003

(54) TELLURIDE QUATERNARY NONLINEAR OPTIC MATERIALS

(75) Inventors: Melvin C. Ohmer, Dayton, OH (US); David E. Zelmon, New Carlisle, OH (US); Jonathan T. Goldstein, Kettering, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/360,824

(22) Filed: Jul. 26, 1999

(51) Int. Cl.[7] .............................. G02B 5/20; C01B 25/14
(52) U.S. Cl. ........................ 252/584; 252/582; 423/508
(58) Field of Search ................................. 252/582, 584; 423/508; 359/328

(56) References Cited

U.S. PATENT DOCUMENTS

| | | |
|---|---|---|
| 3,628,023 A | 12/1971 | Paoli et al. |
| 3,855,607 A | 12/1974 | Kressel et al. |
| 4,233,092 A | 11/1980 | Harris et al. |
| 4,450,356 A | 5/1984 | Murray et al. |
| 4,717,444 A | 1/1988 | Hill et al. |
| 4,811,077 A | 3/1989 | Fowler et al. |
| 4,879,723 A | 11/1989 | Dixon et al. |
| 5,070,505 A | 12/1991 | Dixon |
| 5,142,542 A | 8/1992 | Dixon |
| 5,157,674 A | 10/1992 | Lawandy |
| 5,198,673 A | 3/1993 | Rougeot et al. |
| 5,216,484 A | 6/1993 | Chao et al. |
| 5,355,247 A | 10/1994 | Byer et al. |
| 5,400,173 A | 3/1995 | Komine |
| 5,475,526 A | 12/1995 | Byer et al. |
| 5,526,338 A | 6/1996 | Hasman et al. |
| 5,611,856 A | 3/1997 | Schunemann et al. |
| 5,633,033 A * | 5/1997 | Nishitani et al. ........... 423/508 |
| 5,663,883 A | 5/1997 | Shi et al. |
| 5,644,185 A | 7/1997 | Miller |
| 5,722,249 A | 3/1998 | Miller |
| 5,821,536 A | 10/1998 | Pettit |

OTHER PUBLICATIONS

Textbook "Handbook of Thermo–Optic Coefficients of Optical Materials with Applications" Chapter 2, pp. 16–17, 1998, Academic Press, San Diego Cal.

"Phase studies, crystal growth, and optical properties of $CdGe(As_{1-x}P_x)_2$ and $AgGa(Se_{1-x}S_x)_2$ solid solutions" authored by J.C. Mikkelsen, Jr. and H. Kildal appearing in Journal of Applied Physics vol. 49, No. 1, Jan. 1978.

* cited by examiner

Primary Examiner—Philip Tucker
(74) Attorney, Agent, or Firm—Gerald B. Hollins; Thomas L. Kundert

(57) ABSTRACT

A solid state laser device made from a nonlinear optic quaternary alloy of Silver, Gallium, Selenium and Tellurium semiconductor material or Silver, Gallium, Sulfur and Tellurium semiconductor material. The Tellurium component in each alloy provides quaternary alloying anion modification of an underlying ternary semiconductor crystal and achieves tuning of the birefringence and tuning of the wavelength passband of the semiconductor material. The tuned quaternary alloy enables beam walkoff-free noncritical phase match operation of the laser device including use of a phase match angle supporting optimum use of the material's nonlinear properties, maximized useful length of the material crystal, room temperature wavelength changing operation, significantly increased second order nonlinear susceptibility, a factor of ten reduction in the walk-off angle and photon energy conversion efficiencies several times those usually achieved. The Tellurium alloy component also accomplishes shifting of the semiconductor material energy absorption characteristic to avoid a preferred laser pump wavelength energy absorption peak and assists in circumvention of the thermal lensing phenomenon in the crystal. The accomplished laser device provides infrared energy output while operating in for example either the second harmonic generation or the optical parametric oscillation configurations. Examples involving both related materials and the ultimate quaternary materials are included.

26 Claims, 10 Drawing Sheets

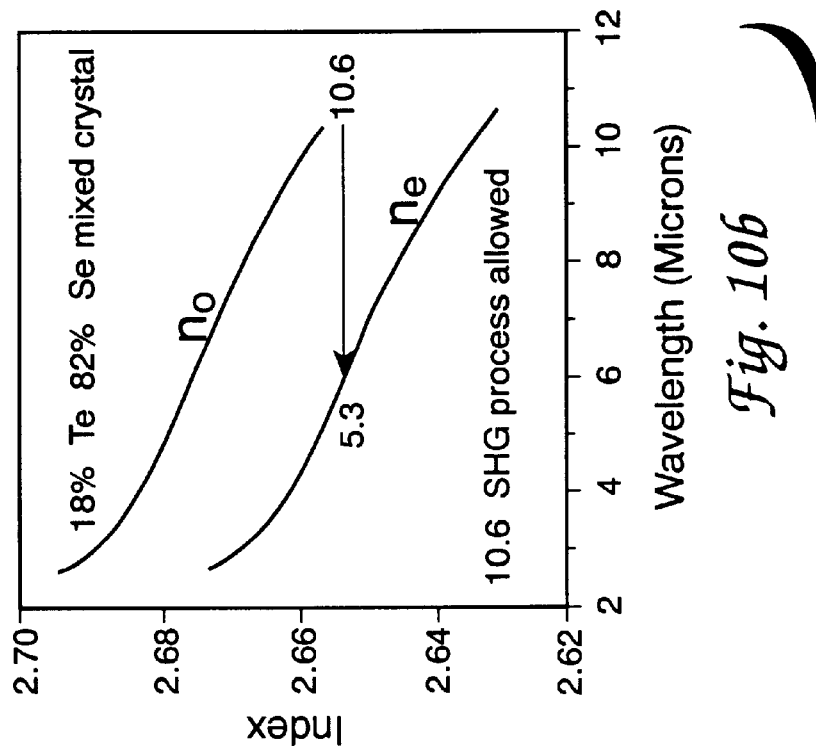
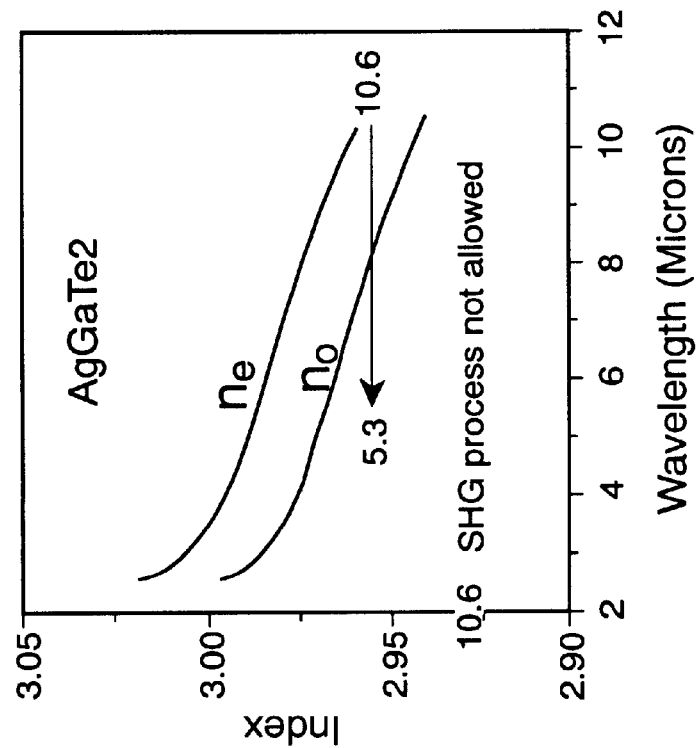
*Fig. 10b*
*Fig. 10a*
*Fig. 10*

TELLURIDE QUATERNARY NONLINEAR OPTIC MATERIALS

CROSS REFERENCE TO RELATED PATENT DOCUMENT

The present document is somewhat related to the and commonly assigned patent document "Utilization of Telluride Quaternary Nonlinear Optic Materials", Ser. No. 09/360,825, U.S. Pat. No. 6,304,583. The contents of this somewhat related application are hereby incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

It has been estimated that over sixty percent of the combat aircraft losses occurring since the 1960's can be attributed to use of infrared responsive surface to air and air to air missiles. Moreover the existence of newer more sophisticated generations of these missiles including the usually hostile SAM 16, SAM 17 and SAM 18 missiles is now known in the western world. Missiles of these latter types are understood to include countermeasures capabilities making the traditional hot flare and similar basic defensive measures against heat seeking missile attack of limited or little value. Although improved aircraft defensive measures based on laser energy sources have been used to some degree with respect to such missile weapons, until recently laser based infrared countermeasures have been laser source-limited, that is limited in both the available output power level and the spectral coverage achievable. In a very real sense therefore the missile and missile countermeasures battle scene has recently been biased in favor of the missile and its seeker by these power level and spectrum limitations.

As late as 1997 for example the best available solid state laser infrared source for missile countermeasures use operated in the range of five watts of average power level and provided little energy output in portions of the infrared spectrum known to be considered in the sensor of later design missiles. Although laser materials based on a certain class of chalcopyrite alloys have recently made it possible to exceed this 1997 power level by a factor of four and to achieve peak powers in the range of a hundred million watts per square centimeter in a nonlinear optical crystal material, even higher power levels and operation in yet inaccessible portions of the infrared spectrum are viewed as desirable improvements in the missile defense art. The present invention addresses this area of need and provides an infrared capability that is useful in areas other than the missile defense field.

Other needs for the present invention are also believed to exist within the military art. Following the decrease in tensions between major world powers in the 1990's, the threat of chemical or biological weapons used by smaller potential adversaries has emerged as a remaining and ongoing concern for the United States and other free world military forces. With regard to such chemical or biological weaponry it is known for example that one chemical warfare agent now available to most potential adversaries, i.e., the mustard gas of World War I infamy, provides a readily detectable and remotely sensible signature in a specific region of the infrared portion of the electromagnetic spectrum. This signature is, however, somewhat limited in bandwidth and therefore requires access to parts of the infrared spectrum which are not conveniently available with many laser sources. Similar limited spectrum signatures are believed to exist for other chemical and biological warfare agents. The remote, safe distance, sensing of such agents is of clear desirability in protecting the people and equipment necessary to a military operation. However the variety of threats posed by potential chemical and biological weapons now suggests that access to virtually unlimited areas of the infrared spectrum is desirable in the development of chemical and biological warfare defensive apparatus.

From a third perspective, an equal or perhaps even greater military interest in the infrared spectrum is prompted by the presence of windows of reduced atmospheric absorption located in certain specific bands of the infrared spectrum, especially for example in the 2–6 micrometer wavelength band and in the 8–12 micrometer wavelength band. These windows are believed to offer opportunity for communication, surveillance, and other military and civilian uses not currently considered feasible. The current situation in infrared spectrum applications may in fact be comparable with the somewhat recent advent of increased limited spectrum coverage and spectrum agility in the radar utilized microwave frequency parts of the electromagnetic spectrum, a development which has for example made spectral distinction between rain, snow and sleet possible in a weather radar system. In addition to military uses there of course exists numerous communication, detection and object-illumination applications in the non military world which can be benefited by efficient access to specific and possibly newly available portions of the infrared spectrum.

As a practical matter however infrared emitters usable in the most desirable infrared emission source, i.e., usable in the solid state stimulated emission coherent output devices such as the semiconductor laser, generate outputs at certain specific wavelengths. These wavelengths are moreover separated by infrared and other spectral regions in which no desirable efficient direct emission source is available. The gas-based carbon dioxide laser is a non-solid state example of this situation in that such lasers are for example known to have strong emission lines residing at wavelengths of 9.3 and 10.6 microns. Emissions at wavelengths falling between these two wavelengths or at specific wavelengths above and below these wavelengths is significantly less.

The use of wavelength changing devices, devices based on the nonlinear optic characteristics of certain single crystal semiconductor materials, offers one approach for providing energy at otherwise inaccessible spectral locations. Prior to the early 1970's there was in fact little access to the wavelengths greater than 4 microns with the available ruby, Neodidium, YAG, Lithium, Argon and other laser materials of common usage—even with the use of the then available nonlinear and wavelength changing materials. In a similar manner, outside the infrared range an absence of sources in the 1 to 2.5 micron range of wavelength, especially for applications needing tunability, was difficult even when using wavelength mixing arrangements. The utility of a wavelength halving apparatus may be appreciated by, for example, considering that halving the wavelength (doubling the frequency) of the 10.6 micron emission line from a carbon dioxide laser provides an output at the wavelength of 5.3 microns, a wavelength at the extreme end of the two to six micrometer window where the most advanced missiles operate, a wavelength which is inaccessible to most laser materials.

The expression "nonlinear optic characteristics" when used in connection with the materials of such wavelength changing devices is generally understood to relate to the properties of crystal materials in which light transmission characteristics are intensity-dependent, i.e., materials in which the optical refractive index, n, is a function of the electric field strength vector, E, of the light wave. This representation is of course based on a Maxwell's equation model of light and the understanding that light energy is fairly described in terms of electric field strengths. The light wave index of refraction, n(E), is moreover represented as the sum of terms in an infinite series expansion of electric field strength vectors taken to the powers or exponents of zero, one, two and so on with each series term also including a factor of the form $n_0$, $n_1$, $n_2$ and so on representing a refractive index. In mathematical symbols this relationship may be expressed as:

$$n(n\ E) = n_0 + n_1 E + n_2 E^2 + n_3 E^3 + \ldots \quad (1)$$

or alternately as:

$$n(E) = n_0 + \Delta n \quad (1a)$$

$$\Delta n = 2\pi/n_o [\chi^{(2)} E + \chi^{(3)} E^2 + \chi^{(4)} E^3 \ldots] \quad (1b)$$

The material property of interest is $\chi^{(2)}$. The zero exponent E term, i.e. the $n_0$ term in the equation 1 series, corresponds to the refractive index used in traditional linear optics, the optics considered in entry level physics courses. The nonlinear materials of interest in the present invention are identified as chi two or second order nonlinear materials, an identification also based on this infinite series representation of the light wave n(E) and recognizing that these present invention materials are adequately characterized by a series of the equation 1 type which terminates with the third term, i.e. terminates with the second power of E, or E squared term.

The alloy Silver Gallium Selenide, $AgGaSe_2$, in single crystal embodiment is presently considered the state-of-the-art carbon dioxide laser frequency doubling crystal, the preferred crystal for use in laser wavelength change devices such as an optical parametric oscillator, a second harmonic generator or a difference frequency generator (i.e., an OPO, a SHG or a DFG device; herein devices each referred-to simply as a "laser device"). For present purposes it may be considered that an optical parametric oscillator provides wavelength doubling or increasing action, the second harmonic generator provides a wavelength dividing or decreasing action and the difference frequency generator a sum and difference frequency mixture output. The term "laser device" is not herein limited to these specific wavelength changing arrangements however and may also identify other stimulated energy, coherent output apparatus. In other words the present invention is deemed not to be limited to a optical parametric oscillator, a second harmonic generator or a difference frequency generator.

As may be noted in the preceding and several other earlier paragraphs herein, the once universal convention of capitalizing the names of periodic table elements is observed in the present document. Additionally, the Silver Gallium Selenide, $AgGaSe_2$, material is for example recognized as being formally classed as a "di-selenide" material. In the interests of brevity and simplicity however, such formal reference is omitted herein and this material, as well as the other similarly classifiable materials, are herein referred-to by the shorter Silver Gallium Selenide and similar names.

The photon conversion efficiency of this $AgGaSe_2$ state-of-the-art and most widely used infrared nonlinear optical crystal material is limited in wavelength doubling service because of its non optimal birefringence characteristic. In view of such birefringence limitation, laser apparatus use of this material results in a crystal phase matching angle failing to effectively utilize the available optical nonlinearity of the material, a phase matching angle also allowing excessive walk-off of the signal and pump beams within a $AgGaSe_2$ crystal and the accompanying severe loss of photon conversion efficiency. The terms "birefringence" and "walk-off" are believed known in the art and are discussed and defined in some detail in the ensuing paragraphs of this disclosure. Relatively low thermal conductivity and the resulting thermal lensing tendency is another area of difficulty with this $AgGaSe_2$ state-of-the-art nonlinear optic material. Yet another limitation of $AgGaSe_2$ is excessive photon energy absorption at a wavelength of two microns, a limitation which limits its performance in two micron-pumped optical parametric oscillation-based laser systems.

Other nonlinear optical materials are of course available for possible use in overcoming these difficulties with Silver Gallium Selenide. Some such materials together with Silver Gallium Selenide are classified as chalcopyrite materials in a broad sense of the term chalcopyrite. Included in these other materials are for example Silver Gallium Sulfide, $AgGaS_2$; Zinc Germanium Phosphide, $ZnGeP_2$ and Cadmium Germanium Arsenide, $CdGeAs_2$. With the possible exception of the first of these materials, known limitations of the material make these other materials even less desirable in practice for present need laser wavelength changing use and have therefore contributed to the $AgGaSe_2$ material having its current state-of-the-art status. The Silver Gallium Sulfide, $AgGaS_2$, material, when modified into a somewhat related four element or quaternary alloy as disclosed herein, is deemed a viable and complementary material for use in nonlinear optical apparatus, especially in view of the transparency in the red end of the visible wavelength portions of the optical spectrum it provides and the resulting wavelength-change coverage of an additional spectral region.

The Silver Gallium Selenide material is considered in significant detail in the first of the examples included in the present patent document. As related subsequently herein this detailed consideration of Silver Gallium Selenide is partly based on it being a nonlinear chalcopyrite material of close relationship to one of the quaternary alloys of principle focus in the present patent document—and therefore of interest in the present "closely related material" disclosure of this quaternary alloy. The consideration of Silver Gallium Selenide herein is also based on the fact that the properties of this three element or ternary alloy are in some specific characteristics similar to those of one focused upon quaternary material, i.e., $AgGa(Se_{(1-x)}Te_x)_2$. Moreover the present document interest in the Silver Gallium Selenide ternary material is also based on the fact that it is a viable starting component for fabricating this one of the focused upon quaternary materials. Similar relationships are seized upon in the present patent document with respect to another focused upon quaternary material, Silver Gallium Sulfide, $AgGa(S_{(1-x)}Te_x)_2$, as is described in detail in the following paragraphs and the examples disclosed below.

Returning to the present background of the invention discussion, in view of little more than the recited limitations of what is considered to be the state of the art best infrared wavelength changing material, there is clearly need in the laser apparatus art for a frequency doubling material offering a more desirable combination of performance characteristics than has heretofore been available. The present invention is believed to provide desirable answers for this need in the form of Tellurium-inclusive quaternary alloy chalcopyrite materials and their utilizations. The present invention focuses on two Tellurium-inclusive alloys including the quaternary alloys Silver Gallium Selenide Telluride, AgGa$(Se_{(1-x)}Te_x)_2$ and Silver Gallium Sulfide Telluride (i.e., Silver Thiogallate Telluride), AgGa$(S_{(1-x)}Te_x)_2$. These quaternary alloys are considered relevant over a range of Selenium/Tellurium and Sulfur/Tellurium compositions as is indicated by the complementary x subscript notations in these chemical formulas. The present invention is, however, deemed not to be limited to these specific Tellurium alloys.

SUMMARY OF THE INVENTION

In the present invention the periodic table element Tellurium is added to chalcopyrite single crystal nonlinear optical materials in order to achieve new and superior performing infrared laser devices. The resulting chalcopyrite material may be a quaternary alloy of either Silver Gallium Tellurium and Sulfur or Silver Gallium Tellurium and Selenium. These materials although somewhat similar provide wavelength changing accommodation of differing infrared wavelength regions. By adding the periodic table element Tellurium, the birefringence of the resulting single crystal alloy can be tuned to a desirable value for a given wavelength multiplying or dividing action in the laser device. This Tellurium addition also contributes to parallel input and output beam travel in the single crystal material, a travel maintainable without beam walkoff degradation. The addition of Tellurium also shifts an absorption characteristic of these materials to longer wavelengths and thereby limits energy losses and assists in controlling beam quality degradation caused by thermal lensing in laser device material.

It is an object of the present invention therefore to provide Telluride-inclusive quaternary alloy nonlinear optical materials of tunable birefringence and enhanced solid state infrared laser efficiency capability.

It is another object of the present invention to provide a single crystal nonlinear optical material improved through use the element Tellurium in a quaternary alloy single crystal structure.

It is another object of the present invention therefore to provide a crystalline nonlinear optical material improved through addition of a wide fractional range of the element Tellurium to the material's crystal lattice.

It is another object of the invention to provide a crystalline nonlinear optic material of significantly enhanced photon energy conversion efficiency.

It is another object of the invention to provide a crystalline nonlinear optic material of decreased photon energy absorption characteristic in certain desired infrared wavelength regions.

It is another object of the invention to provide a nonlinear optical material of selectable birefringence capability.

It is another object of the invention to provide increased laser wavelength conversion efficiency through utilization of increased useful length in a wavelength conversion crystal.

It is another object of the invention to provide a nonlinear optical alloy achieved through replacement of traditional cation alloying elements with more efficient anion alloying elements.

It is another object of the invention to provide a nonlinear optical alloy achieved through replacement of traditional cation alloying by lower concentration anion alloying.

It is another object of the invention to provide a nonlinear optical material in which desirable nonlinear properties are achieved without introduction of optical properties disturbing disorder in a cation sublattice.

It is another object of the invention to provide a material in which desirable nonlinear optical properties are achieved through addition of an element of higher atomic number than has been heretofore used.

It is another object of the invention to provide a indium free nonlinear chalcopyrite crystallographic optical material.

It is another object of the invention to provide a nonlinear optical material enabling non critical phase matching and identical beam trajectory operating conditions in a utilizing laser device.

It is another object of the invention to provide a nonlinear optical material of desirable optical transparency over a wide spectral band.

It is another object of the invention to provide a nonlinear optical material capable of achieving non critical phase match photon energy conversion in a coherent energy generation apparatus.

It is another object of the invention to provide a nonlinear optical material capable of achieving improved input and output wave phase matching with resulting energy conversion efficiencies approaching ninety percent.

It is another object of the invention to provide a nonlinear optical material capable of generating beam walk-off-immune energy conversion in a coherent energy apparatus.

It is another object of the invention to provide a nonlinear optical material enabling photon energy conversion efficiency levels in the range of two to three times those of conventional solid state laser devices.

It is another object of the invention to provide a nonlinear optical material in which material composition and optimum infrared output wavelength of a utilizing coherent energy generation apparatus are related in a known manner.

It is another object of the invention to provide a plurality of laser apparatus materials which are enhanced in nonlinear optical properties through addition of the periodic table element Tellurium in optical properties related proportions.

It is another object of the invention to provide a nonlinear optical material in which a small degree of tuning by beam angle selection or material temperature change is also possible.

It is another object of the invention to provide a nonlinear optical material useful in fabricating laser devices of both the second harmonic generation and the optical parametric oscillation types.

It is another object of the invention to provide a nonlinear optical material useful in achieving high power agile lasers.

It is another object of the invention to disclose the optical properties of a related and possible constituent optical material.

It is another object of the invention to provide information from which the characteristics of nonlinear infrared laser devices can be tailored to specific spectral regions.

It is another object of the invention to provide an early "closely related materials" disclosure of two new nonlinear optical materials.

It is another object of the invention to provide extension of the chalcopyrite family of nonlinear optical materials to include improved materials.

It is another object of the invention to provide the nonlinear optical material Silver Gallium Selenide Telluride AgGa$(Se_{(1-x)}Te_x)_2$.

It is another object of the invention to provide the nonlinear optical material Silver Gallium Sulfide Telluride, AgGa$(S_{(1-x)}Tex)_2$.

Additional objects and features of the invention will be understood from the following description and claims and the accompanying drawings.

These and other objects of the invention are achieved by the single crystal quaternary alloy chalcopyrite semiconductor nonlinear optical material having crystal structure comprising:

a crystalline cubic lattice (304) located at an intersection (306) of 100, 001 and 010 coordinate axes (302, 303, 305) said lattice (304) having lattice initial plane faces (308, 310, 312) received in planes defined by each 100-001, 100-010 and 010-100 axis pairs, having sub lattice-defining lattice mid planes (314, 316, 318) distal to and parallel with lattice initial planes (308, 310, 312) respectively and having exterior face planes (320, 322, 324) distal to and parallel with each lattice initial plane (308, 310, 312) and each lattice mid plane (314, 316, 318) when viewed along any of three paths (326, 328, 330) parallel to a 100, 001 and 010 axes, paths orthogonal to 001-010, 100-010, and 100-001 planes respectively;

Gallium atoms (332) located in each sub lattice corner of a lattice mid plane lying along said 100 axis (302) parallel with said 001-010 plane: plus Gallium atoms (334) located at each sub lattice center in the lattice initial and exterior planes (312, 324) lying along said 100 axis (302) commencing at said 001-010 plane: plus Gallium atoms (336) located at sub lattice centers of said initial, said mid and said exterior planes (310, 316, 322) within a first half (337) of said cube lattice (304), a half located parallel to and adjacent said 001-010 plane, along said 100 axis (302): plus Silver atoms (338) located at each sub lattice coner in lattice initial and exterior plane faces (320, 324) disposed along said 100 axs (302) parallel to said 001-010 plane; plus Silver atoms (340) located at sub lattice centers of said initial, said mid and said exterior planes (310, 316, 322) along said 001 axis within a second half (342) of said cube lattice, a half located parallel to and distal of said 001-010 plane along said 100 axis (302); plus differential number-quantity, similarly located, Selenium and Tellurium atoms (343) received in planes intermediate said lattice initial plane, said lattice mid plane and said lattice external plane immediate planes lying along each of said 100, 001 and 010 axes, said differential number-quantity atoms (343) being disposed in ordered array in random fill anion lattice patterns paralleling each of said 100-010, 100-001, and 010-001 planes.

BRIEF DESCRIPTION OF THE DRAWINGS

FIG. 10a shows one improvement in nonlinear crystal performance achievable with quaternary chalcopyrite alloys.

FIG. 10b shows another improvement in nonlinear crystal performance achievable with quaternary chalcopyrite alloys.

DETAILED DESCRIPTION

Figure 1:
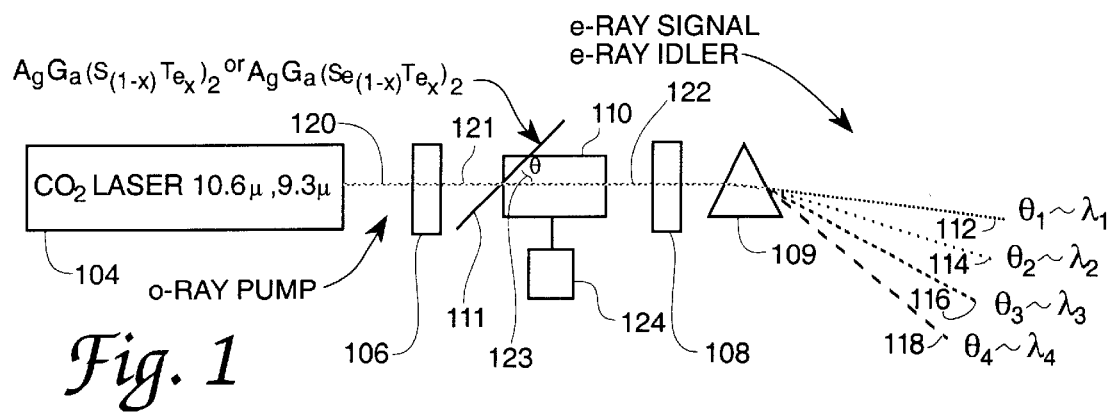
FIG. 1 shows a block diagram of a wavelength changing laser device in which nonlinear optical materials may be used.

The present invention is primarily concerned with the quaternary chalcopyrite alloys Silver Gallium Selenide Telluride, $AgGa(Se_{(1-x)}Te_x)_2$ and Silver Gallium Sulfide Telluride, $AgGa(Se_{(1-x)}Te_x)_2$ and their nonlinear optical properties. The following detailed description relating to these alloys departs somewhat from conventional practices in using the best presently available form of disclosure relevant to these quaternary materials i.e., uses descriptions based on characteristics of the plural ternary chalcopyrite materials of related properties and usability as precursors of the quaternary alloys. The chalcopyrite nature of these precursor alloys together with the often successful practice of extrapolating characteristics within closely related material famflies suggests the validity of this "closely related materials" early disclosure arrangement.

An additional aspect of this disclosure arises from the present documents being the believed first patent disclosure/publication of detailed characteristics relating to one of these precursor chalcopyrite materials, the material Silver Gallium Telluride. Although this material is known in the laser device art, the limited need for this material and previous difficulty in fabricating samples sufficiently large and sufficiently pure for its characteristic measurement have heretofore made such characteristics unavailable and made the material itself of generally limited utility. Moreover applicants have noted below a belief that alloys inclusive of the element Tellurium have been somewhat passed over in the nonlinear optical art.

Applicants' understanding of the prior art in the laser wavelength doubling field therefore suggests the periodic table element Tellurium and especially quaternary chalcopyrite alloys of this element have been largely and surprisingly overlooked in the realization of infrared wavelength doubling materials. This overlooked status includes the large range of specific different quaternary alloys represented by the chemical symbols $AgGa(Se_{(1-x)}Te_x)_2$ and $AgGa(S_{(1-x)}Te_x)_2$ (wherein x is a value between 0.02 and 0.98) and even though the most optimum Tellurium content in such alloys appears to fall in the range around eighteen (18) percent as is more fully discussed subsequently herein. This overlooked status of Tellurium alloys is believed even more surprising in view of extensive study of the similar alloys, AgGaS$_2$ and AgGaSe$_2$, alloys extensively discussed in the technical literature and now readily available commercially.

Terminology and Underlying Concepts

The exceptional text "Handbook of Nonlinear Optical Crystals" by V. G. Dimitriev, G. G. Gurzadyan and D. N. Nikogosyan published in a first edition in 1991 by Springer-Verlag of Berlin, Heidelberg, New York etc. is believed helpful in further understanding nonlinear optical concepts, in defining terminology, disclosing characteristics and explaining theoretical and quantitative considerations relevant to the present invention. Chapter two titled "Optics of Nonlinear Crystals" and in particular section 2.3 of chapter 2 concerning uniaxial crystals are believed notably of interest. A second edition of this handbook was published in 1997 and includes specific materials data but does not appear to change the chapter 2 information. Numerous references to each of the nonlinear optic materials AgGaS$_2$, AgGaSe$_2$ and Tellurium appear under the specific chemical symbol names in the index of the 1991 text and an extensive list of reference publications is provided. Notably the herein disclosed quaternary alloys Silver Gallium Selenide Telluride, AgGa(Se$_{(1-x)}$Te$_x$)$_2$ and Silver Gallium Sulfide Telluride, AgGa(S$_{(1-x)}$Te$_x$)$_2$ appear absent from the handbook texts. The Copyrighted Handbook of Nonlinear Optical Crystals texts are presently referred-to as "the Springer-Verlag Handbook" and the text of each handbook is hereby incorporated by reference herein. In addition to the Springer-Verlag text numerous other patent and publication references are identified in subsequent paragraphs of this document; each of these references is also hereby incorporated by reference herein.

Operation of a nonlinear optical device under improved phase matching energy exchange conditions between input and output optical waves is a notable attribute of the present invention. Such improved phase matching operation is known in the art to increase energy exchange into an output wave by several magnitudes over that of a conventional poorly phase matched energy exchange arrangement. In general terms this phase matched operation involves causing the input and output waves of the nonlinear crystal to travel through the crystal at the same speed even though they are of different frequency or different wavelengths. In other words one condition for efficiently phase matched operation is for the two waves in a nonlinear crystal to experience the same index of refraction notwithstanding their different wavelengths. In the present invention this similar index of refraction and similar velocity are achieved through the "trick" of employing differing polarizations between input and output waves of the nonlinear crystal and thereby achieving maximum energy transfer between the waves. Such operation may be viewed as causing the input wave to vibrate the bonded electrons of the crystal atoms in such a manner as to enable the output wave to absorb the vibration energy with greatest efficiency.

Figure 2:
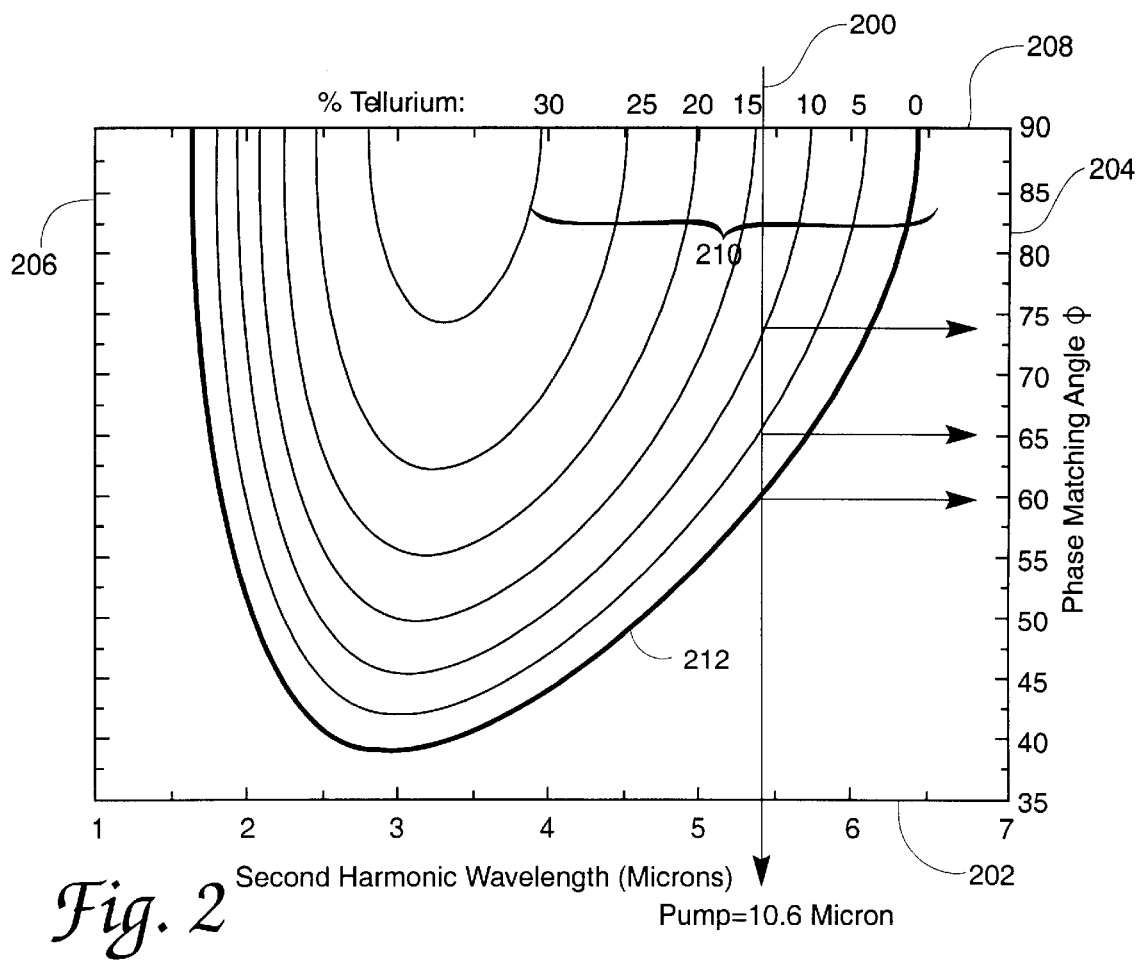
FIG. 2 shows a family of design nomogram curves relating input wavelength, phase matching angle and Tellurium content for one quaternary chalcopyrite material according to the present invention.

Another significant aspect of the present invention is concerned with operating the involved solid state laser device under conditions of noncritical phase matched energy transfer between the differing wavelength input and output beams of the laser device. In particular this noncritical phase matched operation enables the advantages of beam walkoff immunity, higher photon energy conversion efficiency, convenient optical processing of idler and primary output beams from the device, output wavelength tuning of a particular laser device, lowered energy losses and reduced thermal lensing difficulties and possibly other advantages in the laser device. Achievement of noncritical phase matched operation and the resulting performance advantages is made possible by an appropriate selection of laser device materials and material component fractions together with precise selection of input beam positioning with respect to the laser device crystal in order that the output path lie along a major axis of the crystal. Additional considerations regarding this mode of laser device operation are to be found in chapter 2 of the Springer-Verlag Handbook above identified. FIGS. 2.5 and 2.7 of this text and the related discussion of uniaxial crystals in section 2.3 appear particularly relevant.

Wavelength changing in a laser device optical nonlinear crystal is enabled by the birefringence characteristic of the nonlinear crystal material. Two separate rays propagate through a birefringent crystal with each such ray being linearly polarized at a right angle to the other. These two rays, the ordinary ray and the extraordinary ray, are influenced differently during their travel through nonlinear crystal material. The two rays, for example, may encounter two different propagation velocities and two different indices of refraction, i.e., indices of n$_o$ and n$_e$ for the ordinary and extraordinary rays respectively. Additionally the ordinary ray propagates perpendicularly to its wavefront while the extraordinary ray does not. With respect to the present invention it is significant that the angular separation between the two rays in a crystal depends on the direction in which the light travels through the crystal relative to the crystal's optical axis with the exception of light traveling parallel or perpendicular to the optical axis where either polarization propagates parallel to its wavefront.

In order to achieve usable wavelength changing efficiency in a crystal it is needed for the employed crystal material to be possessed of a sufficient degree of this birefringence response to the light energy applied to the crystal. Although many optical materials exhibit some degree of birefringence only a selected group of materials provide sufficient birefringence to be of interest in practical nonlinear optical devices. The chalcopyrite family of materials includes a significant portion of these materials of interest—when the term chalcopyrite is understood to indicate a group of crystal materials having lattice structure resembling that of the original or classic chalcopyrite, i.e., resembling the yellow crystal CuFeS$_2$ material, without, however, limitation to the CuFeS$_2$ material.

The birefringence characteristic therefore indicates the optical material is inherently optically anisotropic in nature, i.e., that its optical properties are not the same in all directions of a sample. Birefringence may result from either different separation between neighboring atoms in a crystal or from the bonds holding neighboring atoms together having different characteristics in different directions. An alternate description of the crystal is that the atoms in such a crystal are more closely located in some planes through the material than in other planes and therefore the optical properties of the crystal differ in different directions. The birefringence characteristic of an alloy material also is responsive to both the alloy composition of the material and the temperature of the material. In the present invention this alloy composition sensitivity is used to particular advantage. Temperature sensitivity of the birefringent nonlinear material is accommodated in a laser device by thermal conductivity aspects of the material, by selecting the material composition in response to the available ambient environment or by temperature control of the material or some combination of these arrangements as is known in the thermal art. Externally sourced cooling and heating may then be used to maintain this desired crystal temperature.

Figure 6:
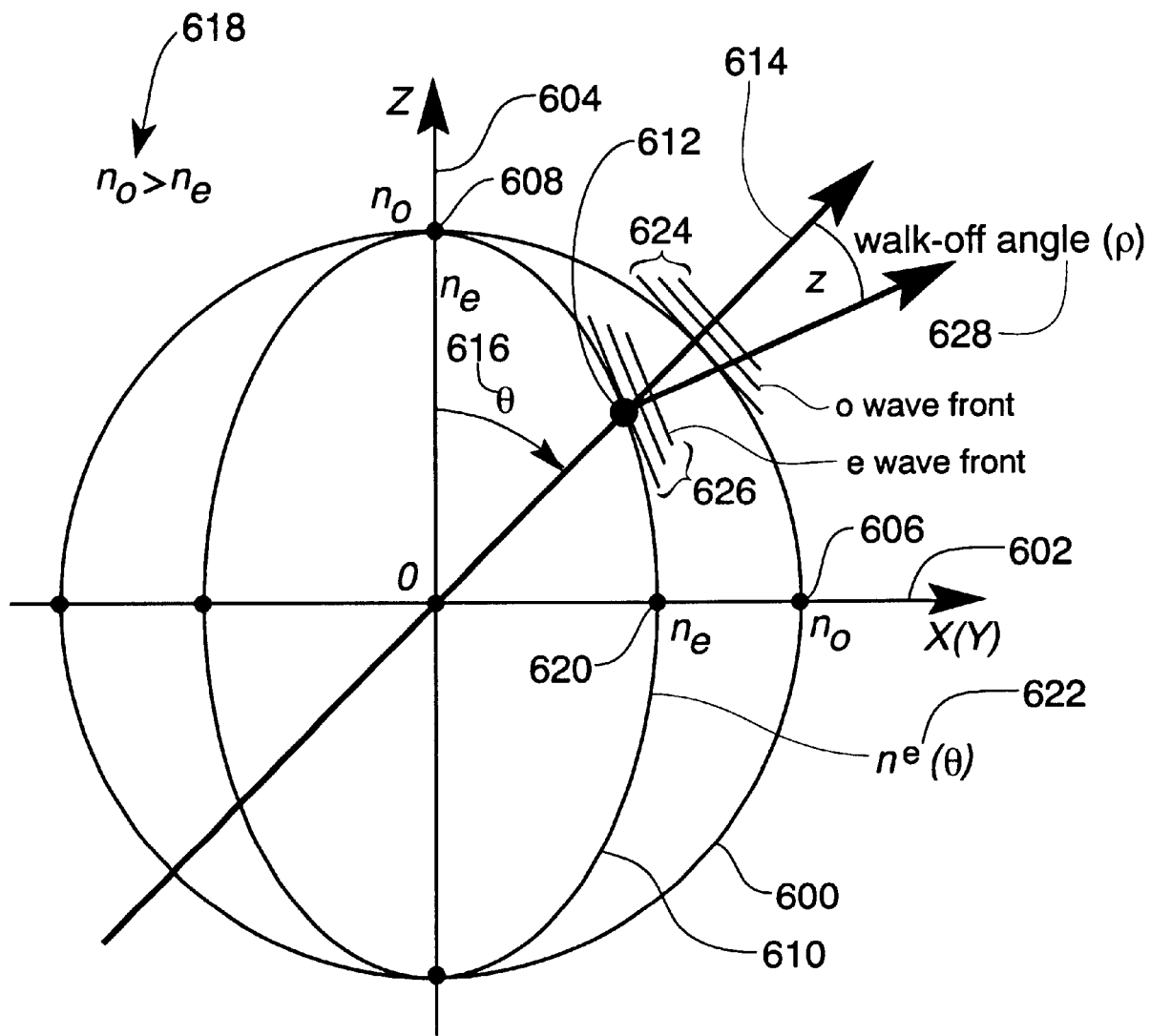
FIG. 6 shows a representation of the indices of refraction for ordinary and extraordinary waves in a negatively birefringent nonlinear uniaxial crystal such as the materials disclosed herein.

Birefringence is often defined quantitatively in terms of the difference between two indices of refraction, n$_o$ the index of refraction for an ordinary wave and $n_e$ the index for an extraordinary wave in the material. If $n_o$ is the larger of the two indices, and the ordinary wave thereby travels slower than the extraordinary wave in the crystal, as is the case of primary interest for the present quaternary chalcopyrite alloys, then the material is said to have a negative birefringence characteristic. The indices of refraction for negative birefringence material is often described in terms of a geometric ellipse, representing the $n_e$ refractive index, being inscribed within a circle representing the no refractive index, this representation is discussed more fully in the following paragraphs herein and is illustrated in FIG. 6 of the drawings.

Efficient energy transfer between input and output beams of a nonlinear crystal requires these two beams to remain in a parallel and closely aligned condition while passing through the crystal, i.e., requires absence of the beam walkoff condition. Negative birefringence wherein $n_o$ is greater than $n_e$ is particularly of interest with respect to the present invention since it enables laser device operation in the "noncritical phase matched operating mode", a mode in which angular divergence walkoff between the ordinary and extraordinary beam outputs of the nonlinear crystal is absent. Both the $n_e$ and $n_o$ indices for a birefringence material vary with the composition of the material, i.e., with the Tellurium content in the present quaternary alloy instance. Stating this relationship in a differing manner it can be said that achievement of specific $n_e$, $n_o$ and $n_e$-$n_o$ values and realizing the desired noncritical phase match condition is possible through selection of the crystal material or the alloy composition. Materials in which $n_e$ exceeds $n_o$ are conversely said to have positive birefringence; such positive birefringence material does not enjoy the noncritical phase match operation nor walkoff immunity characteristics.

The phenomenon of walkoff or Poynting vector walkoff in a nonlinear optical device is believed to be well understood in the optical art and is therefore recited without substantial elaboration in the present patent document. Chapter 2 in the Springer-Verlag text identified herein includes several mathematical equations used to quantitatively evaluate the walkoff phenomenon in specific settings. The phenomenon is also considered at length in several issued U.S. Patents including the U.S. Pat. Nos. 5,847,861 and 5,365,366 of J. D. Kafka et al., U.S. Pat. No. 5,732,095 of P. Zorabedian, and U.S. Pat. No. 5,297,156 of D. A. G. Deacon.

The differing velocity of a light wave in different directions in an anisotropic crystal is therefore significant with respect to the present invention. These differing velocities are often described by way of considering the differing indices of refraction for a linearly polarized light vector in the three coordinate directions of the anisotropic material as three defining axes of an "index ellipsoid". Planar ellipsoidal sections taken through the origin of the "index ellipsoid" then define the index of refraction for a particular direction through the material. This ellipsoid-based, essentially geometric, analysis gives rise to the frequent appearance of trigonometric and second power terms in the mathematical expressions characterizing nonlinear optical material properties. Additional information regarding these matters is to be found in chapter 2 of the above identified Springer-Verlag handbook text.

Such ellipsoidal sections are each themselves of elliptical shape as is represented in FIG. 6 herein and the major and minor axes of such ellipse represent the refractive indices or fast and slow wave velocities relevant to a given direction through the material, i.e., refractive indices or fast and slow wave velocities for light beamed along a normal to the plane of the major and minor ellipse axes. When the indices of refraction for a certain type of crystal are not unequal in these three coordinate directions, the index ellipsoid is characterized by an axis of revolution or axis of symmetry and has the shape of an ellipsoid of revolution; light is propagated along this axis of revolution as if the material is not anisotropic but is isotropic i.e., its velocity is independent of polarization state and the two indices of refraction are equal. The ellipsoid section taken at right angle to this axis of revolution is of circular shape. Crystals of this material, e.g., crystals of the materials used in the present invention, are said to be of a uniaxial nature. In contrast with this uniaxial material, the index ellipsoid in nonlinear optic crystals of low symmetry, i.e., biaxial crystals, includes three unequal axes. The materials of interest in the present invention are of this uniaxial type.

Refractometry methods known in the art may be used in determining the index of refraction of the materials discussed herein. Such refractometry must, of course, consider the birefringence characteristics present and recognize that refractometry techniques dependent on simple Snell's law refraction relationships are not valid for the extraordinary beam output of a chalcopyrite or other nonlinear material sample. The present inventors have experienced satisfactory refractometry measurement results using prism spectrometer measurements of the minimum deviation angle D, provided by a chalcopyrite material sample and the fundamental relationship:

$$D=\theta_1+\theta_2+A \quad (2)$$

where $\theta_1$ and $\theta_2$ are the angles between incident and exit measurement beams and the normal to the prism surface at the point of entrance or exit and A is the prism angle between entrance and exit surfaces. This equation 2 relationship may be supplemented with additional trigonometric relationships including:

$$n=[\sin \tfrac{1}{2}(A+D)]/\sin \tfrac{1}{2}A \quad (3)$$

so long as the measurement procedure is limited to the ordinary ray output of the prism sample where Snell's law is relevant. The symbol n is the sought-after index of refraction in equation 3. Other refractometry measurements based on for example real and apparent thickness dimensions of a planar sample and the critical angle of total reflection are known in the art.

In the interest of completeness several additional equations considered helpful in defining the characteristics of both positive and negative birefringence materials are presented here. Additional equations relevant to specific materials and their characteristics are also included in the later examples of this document. The first of these additional equations concerns the effective or usable nonlinear coefficient of a chalcopyrite material with a positive birefringence, a material such as the later example discussed $AgGaTe_2$ and $AgInSe_2$ materials. For the usually assumed symmetry conditions (i.e., $d_{36}=d_{14}$) and for Type I phase matching this nonlinear coefficient is expressed by:

$$(d_{oee})_{eff} \text{ or } (d_{eeo})_{eff}=d_{36}\sin 2\theta\cos 2\phi=d_{36}\sin 2\theta (\text{usual } \phi\text{choice}) \quad (4)$$

where $\theta$ is the internal angle between the optical or c-axis and the direction of propagation for which phase matching occurs, $\phi$ is the azimuthal angle which may be chosen such that $\cos 2\phi$ is one, and $d_{36}=(\chi_{12})/2$ is the nonlinear optical coefficient $\chi^{(2)}$ is the second order nonlinear susceptibility. The nonlinear coefficient is additionally discussed in the reference by J. L. Shay and J. H. Wernick, *Ternary Chal-* copyrite *Semiconductors: Growth, Electronic Properties, and Applications* (Pergamon, New York, 1975).

The corresponding figure of merit for energy conversion efficiency (FOM) is given nominally by, $$FOM = (d_{36} \sin 2\theta)^2 / n^3, \quad (5)$$

where n is the average index of refraction well below the band gap. Note that the FOM is largest for $\theta=45°$ and zero for $\theta=90°$ and it scales as $(d_{36})^2$.

The phase matching angle is uniquely determined by the refractive indices and their dispersion which are themselves almost totally determined by the fundamental band structure. The angle is given by the following expression for $n_e > n_o$, the condition known as positive birefringence, and for Type I phase matching which makes maximum use of the available birefringence.

$$\sin^2 \theta = (n_e/n_o')^2 [(n_o'+n_o)(n_o'-n_o)/(n_e+n_o)(n_e-n_o)] \quad (6)$$

or $$\sin^2 \theta = (n_o'-n_o)/\Delta n \quad (7)$$

The effective or usable nonlinear coefficient of a chalcopyrite with a negative birefringence such as the later example disclosed $AgGaSe_2$ or $AgGaS_2$ or the $AgGa(Se_{(1-x)}Te_x)_2$ or $AgGa(S_{(1-x)}Te_x)_2$ materials, the FOM and the birefringence angle each for the usually assumed symmetry conditions (i.e., $d_{36}=d_{14}$), and for Type I phase matching is:

$$(d_{oee})_{eff} \text{ or } (d_{eeo})_{eff} = d_{36} \sin \theta \sin 2\phi \quad (8)$$

$$FOM = (d_{36} \sin \theta)^2 / n^3 \quad (9)$$

$$\sin^2 \theta = (n_e'/n_o)^2 [(n_o+n_o)(n_o'-n_o)/(n_e+n_o')(n_o'-n_e')] \quad (10)$$

or $$\sin^2 \theta = (n_o'-n_o)/(-b), \; b=(n_e'-n_o') \quad (11)$$

Utilizations

FIG. 1 in the drawings shows a block diagram of a laser apparatus in which chalcopyrite materials of the herein disclosed type may be used in a wavelength changing arrangement to achieve infrared spectrum output energy from a convenient coherent energy source. In the FIG. 1 drawing a laser source 104 is used to provide pump energy to a nonlinear wavelength changing crystal 110 of the presently discussed type. The crystal 110 is shown in FIG. 1 to be disposed between two mirrors 106 and 108, mirrors having the partial reflection and partial transmission characteristics normally used with laser cavities. The c-axis or optical axis of the chalcopyrite material crystal 110 is shown at 111 in FIG. 1 together with an angle θ relationship at 123 between the axis 111 and the selected optical path 121–122 through the crystal. As indicated by the differently configured dotted lines at 112, 114, 116 and 118 in the FIG. 1 drawing, output energy from the crystal 110 may be one of several differing wavelengths as is determined by the wavelength changing conditions established in the cavity containing the crystal 110. In FIG. 1 these different output wavelengths are segregated in physical location by the conventional spectrum distributing action of the prism 109. Generally such different unitary outputs are the result of operating the crystal 110 and the cavity it comprises with slightly differing values of the angle θ. Alternately it may be stated that the FIG. 1 operation involves rotating the crystal 110 to get the proper angle θ to provide the desired output wavelength λ.

The laser 104 in the FIG. 1 apparatus is indicated to be of the carbon dioxide type, a device well known in the laser art and a laser having output energy located at the indicated 10.6 micron and 9.3 micron spectral lines. Each of these spectral lines, for example, leads to a desirable doubled infrared wavelength in the FIG. 1 apparatus output energy. By way of the above discussed careful selection of crystal angles and with selection of mirror reflectivity, either of these carbon dioxide laser spectral lines or other spectral components of the laser 104 output may be selected for wavelength doubling (or for another of the above recited OPO, SHG and DFG device three types of spectral location changing mechanisms) within the nonlinear crystal 110 and its surrounding cavity. According to one aspect of the present invention, the photon conversion efficiency between the energy of the input beam 120 and that of an output beam at 112, 114, 116 and 118 is significantly larger than has been achievable with the wavelength conversion materials available heretofore. The FIG. 1 wavelength changing apparatus may be embodied into any of several end use devices, two such end use devices of present inventor interest are disclosed in connection with the drawings of FIG. 4 and FIG. 5 herein.

Even though noncritical phase matched operation of a laser device, as is espoused in the present discussion, significantly stabilizes operation of a FIG. 1 laser device with respect to beam walkoff tendencies such stabilization has practical limits and the maintenance of a selected operating temperature in the crystal 110 can be a significant consideration in a FIG. 1 apparatus. Indeed many such laser devices use temperature change of the crystal 110 as a mechanism for tuning crystal characteristics such as birefringence or refractive indices to a selected range of values. Temperature changes in the crystal 110 may also result in the phenomenon of thermal lensing wherein crystal shape distortions result in lensing characteristics, characteristics that are usually a problem in a use apparatus. Good thermal conductivity within the crystal material is desired in order to conduct away heat generated by energy loss mechanisms in the crystal during both high instantaneous power peaks and during high duty cycle usage.

One general procedure for accommodating these thermal characteristics of a nonlinear optical device crystal is enhanced by the variety of crystal characteristics made available with crystal 110 Tellurium content change as is shown in the nomograph of FIG. 2 for example. According to this arrangement curves of the FIG. 2 type (curves relevant to the temperature of the environment contemplated for a particular FIG. 1 apparatus in lieu of the FIG. 2 room temperature curves) may be used to tailor a particular crystal used at 110 in FIG. 1 to its normal environment. Such arrangement might for example provide a set of crystal characteristics for a low, near absolute zero degrees, temperature for a laser device operated in a shaded outer space location, or a set of –30 degree Fahrenheit characteristics for a missile operated exclusively at high altitude or a set of characteristics tailored for the temperature of boiling water where atmospheric pressure water phase change is usable as a crystal coolant. In the FIG. 1 drawing the box 124 is employed to represent heating or cooling crystal temperature maintenance arrangements possibly needed during uses of the FIG. 1 apparatus according to these temperature considerations.

Figure 4:
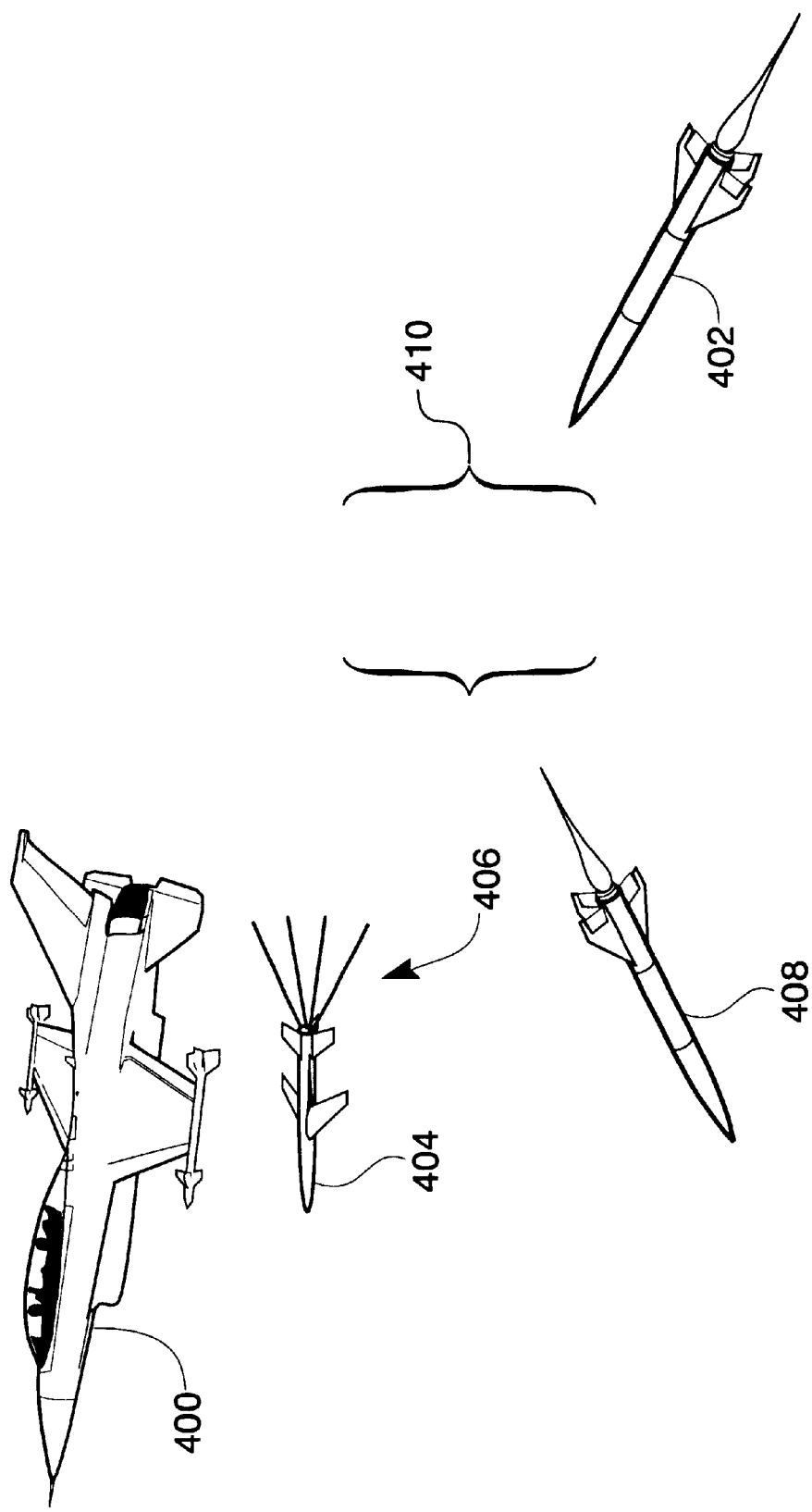
FIG. 4 shows an aircraft countermeasures scene in which photon signals originating in a wavelength changing nonlinear crystal according to the present invention are used.

One military use of the FIG. 1 wavelength shifting laser device and its presently disclosed component materials is represented in the FIG. 4 drawing. In this drawing a tactical aircraft 400 is shown in a defensive encounter wherein it has been identified as a target by two heat seeking guided missiles 402 and 408. The missiles 402 and 408 could be of either ground-based or airborne origin and are presumed to have been designated as a threat by electronic and human-controlled systems included within the aircraft 400. In an attempt to defeat the locked-on status of the missiles 402 and 408 with respect to the aircraft 400, the aircraft has launched an active defensive device 404, a device emitting infrared countermeasures signals received by the heat seeking guidance system of the missiles 402 and 408. These infrared countermeasures signals may be provided with a plurality of signature characteristics intended to for example deceive the missile 402 and lead it away from the aircraft 400 or cause premature/distal and harmless detonation of the missile's warhead.

Since the defensive device 404 may include a propulsion system of its own and thereby appear as a viable heat source target to the antiaircraft missile 402, some embodiments of the missile 402 can be neutralized as a threat to the aircraft 400 by nothing more than the defensive device 404 providing its own reasonable heat signature. Later developed and more sophisticated antiaircraft missiles, however, are believed capable of distinguishing the heat signature of the aircraft 400 from that of the defensive device 404 (these later antiaircraft missiles are also of course capable of ignoring the heat signature of the simplified burning flare defensive devices used in world war II and thereafter). Part of this more sophisticated signature distinguishing capability is attributable to improved partitioning of the infrared spectrum within the heat sensing transducers of the antiaircraft missile 402, in other words to a more precise spectral bandwidth selectivity and use of specific "unusual" spectral wavelengths in the heat sensor of the missile 402. In the FIG. 4 scene the additional missile originally threatening the aircraft 400, the missile 408, is shown in a neutralized position and orientation it may occupy following some earlier receipt of guidance system deceiving infrared signals from the defensive device 404. Such signals may for example have been received by the missile 408 in the region 410 and resulted in a disturbance of the locked on target condition achieved by the missile 408 guidance system. The missile 402 will prospectively encounter a similar fate in due course.

One use of the present invention wavelength changing chalcopyrite crystal materials is therefore seen to reside in the capability of these materials to provide usable access to new portions of the infrared spectrum for defensive devices of the type shown at 404 in FIG. 4. Specifically, with use of the present invention materials it becomes possible to tailor one or more electrically generated infrared signals of the type represented at 406 in FIG. 4, i.e., electrically sourced wavelength-shifted laser output signals emitted by the defensive device 404, to essentially any desired portion of the infrared spectrum. With the capabilities disclosed herein it is of course also possible to provide multiple spectrum signatures, time varying signatures and otherwise enhanced signals at 406 for the defensive device 404. Indeed the present invention materials provide efficient usable access to any part of the infrared spectrum that may be utilized by newly emerging heat seeking missile transducers.

Figure 5:
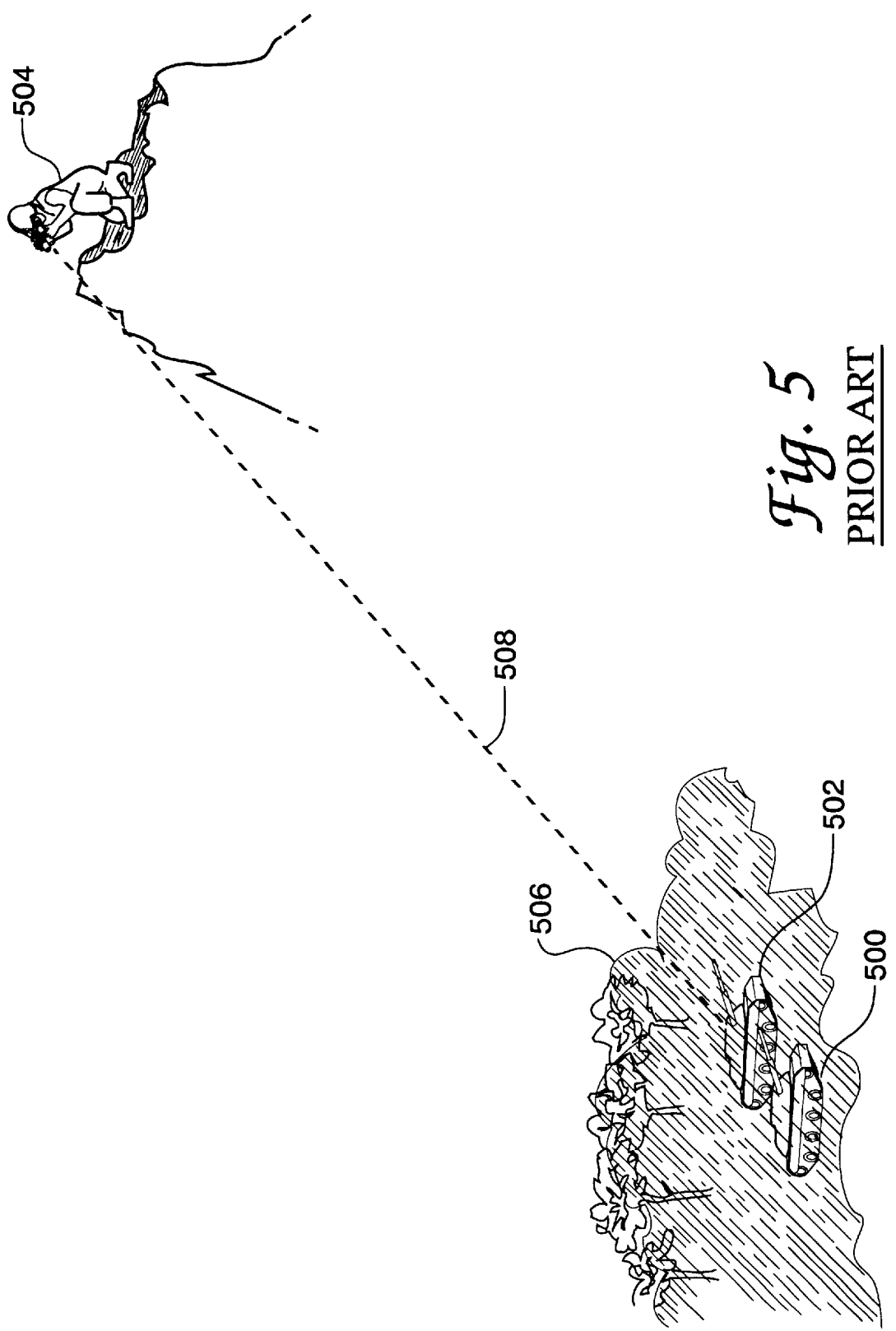
FIG. 5 shows a battlefield surveillance scene in which photon signals originating in a nonlinear wavelength changing crystal are used.

FIG. 5 in the drawings shows another possible military use of the FIG. 1 wavelength shifting laser device and its component materials. In the FIG. 5 drawing a ground base military scene involving possible bio hazard elements such as toxic gasses or biological agents is represented. In the FIG. 5 scene both the personnel within the battle tanks 500 and 502 and other nearby persons, such as the military scout 504 viewing from some safe remote location, have need to know if the dispersed material within the cloud 506 is of natural and safe origin or is the result of enemy activity. Since the battle tanks 500 and 502 can be provided with filters and air sources otherwise isolated from their environment the more pressing need represented in the FIG. 5 scene can perhaps be attributed to the scout 504 and his companion ground force personnel. Indeed such remote safe distance identification of biological hazards is seen as an especially significant use of the present invention laser devices and materials—uses inclusive of both military and non military applications of the disclosed materials, methods and apparatus.

A significant likelihood for usage of the present invention in situations such as those represented in FIG. 5 is to be found in the fact that certain biological hazard agents such as the mustard gas of earlier warfare common usage (as well as present day terrorist interest) is now so easily fabricated in "fertilizer" and "pharmaceutical" infrastructure settings as to pose a low cost and easily available threat to many people in the world. Countermeasures for use against such agents are however known in the art and can be quite effective in the presence of early detection of the hazard. This is again a realm for possible use of the present invention materials methods and apparatus.

With regard to this mustard gas agent it is known in the art for example that this material has a readily discernible signature located in the infrared spectrum regions made accessible through use of the wavelength changing capability of the present invention. Such infrared signatures are believed to exist for other and indeed many or most of the known biohazard agents including those of bacterial and virus origin. The flexibility of tailoring an illumination device usable by a person such as the FIG. 5 scout 504 to a specific infrared wavelength characteristic of each such agent or to a plurality of wavelengths characteristic of several such agents is therefore of significant military utility. Once such infrared signatures are identified, an extended line of sight path such as the path 508 in FIG. 5 may be used to remotely identify the presence of such agents from a safe distance.

Notably such FIG. 5-represented identification can be based on material absorption of specific wavelength energy sourced from the present invention materials or on reflection of this energy back to a sending instrument or on some combination of wavelength dependent reflection and absorption. Parenthetically it may be of interest to note that although such FIG. 5-related optical detection of gases and aerosols is made possible or significantly enhanced through use of the present invention, other techniques allowing the detection of these and other materials by way of physical contact between the material and a sensor element are known in the art and have in fact been disclosed in prior art patents of other persons associated with the assignee of the present invention, see for example the U.S. Pat. Nos. 5,071,770; 5,045,285 and 4,893,108 of Edward S. Kolesar Jr. The Kolesar detection arrangements may involve Fourier Transform signal processing of changed electrical resistance-based signals.

Crystal Structure

FIG. 3 in the drawings consists of three crystal structure views relevant to chalcopyrite materials. More precisely the FIG. 3 crystal structure is relevant to several chalcopyrite materials discussed in the present document including the $AgGaTe_2$ material of example 1 below, the $AgGaSe_2$ material of example 2, and the $AgGaS_2$ material of example 3 and the Silver Gallium Selenide Telluride, $AgGa(Se_{(1-x)}Te_x)_2$ material of example 6. With slight modification the FIG. 3 structure is also relevant to the AgGa$_{(1-x)}$In$_x$Se$_2$ cation material discussed in example 5 below.

Figure 3:
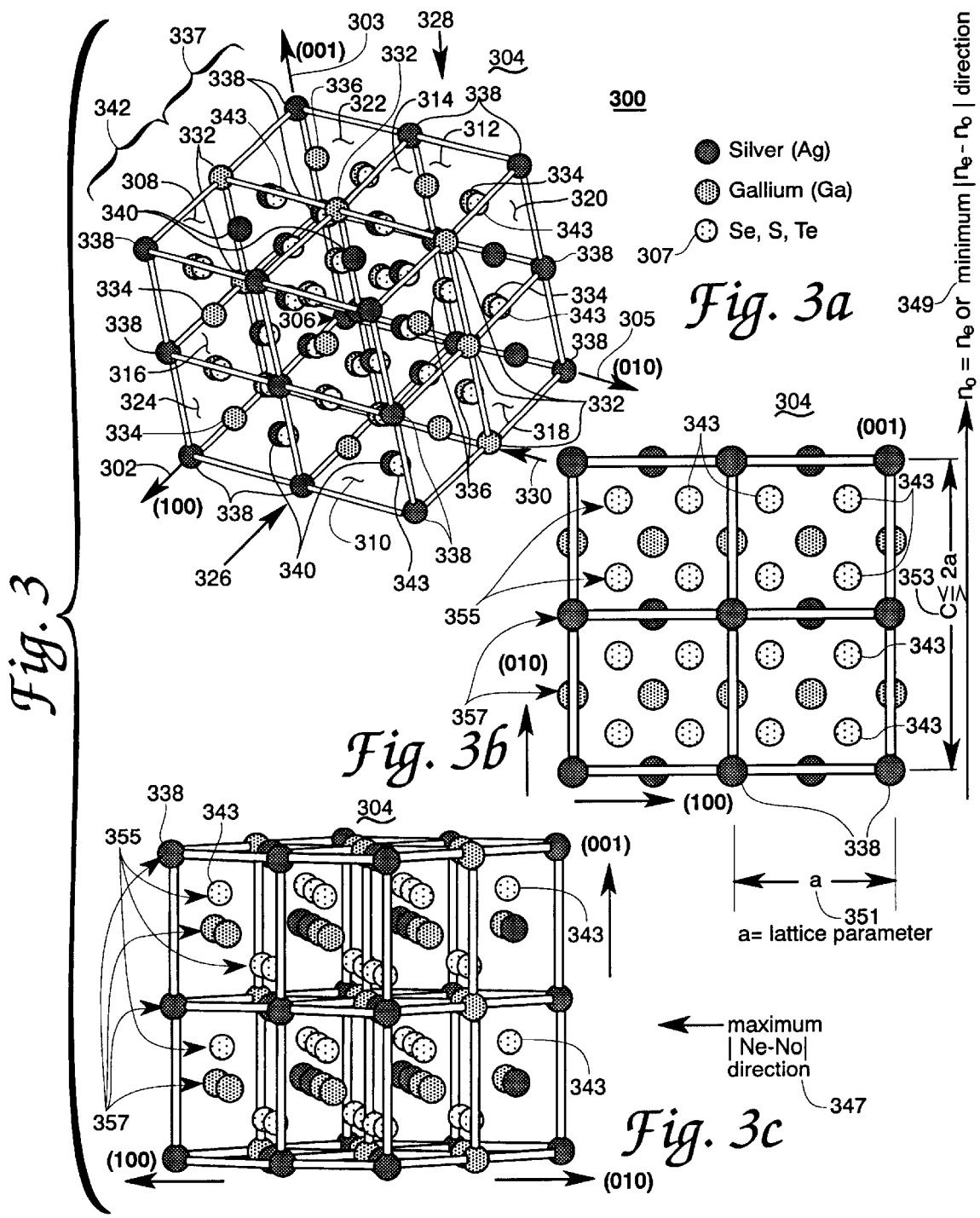
FIG. 3a shows a three dimensional perspective view of a chalcopyrite crystal.
FIG. 3b shows an elevation view of a chalcopyrite crystal.
FIG. 3c shows a rotated three dimensional elevation view of a chalcopyrite crystal.

In the FIG. 3 drawings FIG. 3a shows a three dimensional tilted perspective representation of a quaternary chalcopyrite crystal and FIG. 3b shows a face centered view of the FIG. 3a crystal as it appears looking in a direction parallel with the 001 axis of FIG. 3a and therefore looking down on the FIG. 3a crystal. FIG. 3c in the FIG. 3 views shows the appearance of the FIG. 3a and FIG. 3b crystal from a slightly elevated point lying intermediate the 100 and 010 axes of FIG. 3a. The axis 302 in FIG. 3a and the other axes 301 and 303 in the FIG. 3 views may be used as guides to identify planes being discussed in the following paragraphs.

Parenthetically the FIG. 3a view of the FIG. 3 chalcopyrite material can itself present visualization and illusion difficulties; it is for example easy to interpret the outline of this drawing as a planar hexagon having slightly tilted sides rather than as the intended three dimensional cube. Realization that the lowermost and uppermost corners in the FIG. 3a drawing represent lower plane and upper plane end points of a first major cube diagonal may be helpful in achieving the desired perspective. Similarly the rightmost and leftmost corners in the FIG. 3a drawing represent lower plane and upper plane endpoints of a second cube diagonal, a diagonal somewhat orthogonal to the first diagonal. A color representation of the FIG. 3 drawings wherein the colors, according to the atom composition key at 300, are red, green and yellow respectively, is also helpful in visualization; (such a representation can be made from the FIG. 3 drawings with coloring pencils). Representations of this nature made with the commercial software "MACMOLECULE"™ appear on the front cover of the periodical publication "MRS Bulletin", Volume 23 number Jul. 7, 1998, Materials Research Society, Warrendale Pa. The "MRS Bulletin" drawing is identified as being relevant to a different chalcopyrite material, Zinc Germanium Phosphide, however the present chalcopyrites, and indeed many chalcopyrite materials, are of similar crystal structure.

In the FIGS. 3a, 3b and 3c representations, atoms of the four elements comprising the quaternary chalcopyrite material appear in specific lattice locations and are represented by the different drawing shadings shown in the FIG. 3a key at 300. Only three atoms are represented in this key and in the lattice structures since two of the quaternary elements, either Sulfur and Tellurium or Selenium and Tellurium, are present in x and 1−x differential fraction amounts in the quaternary alloys and therefore cause the FIG. 3a drawing to differ for each possible alloy composition if these elements are precisely distinguished in a drawing. The sites occupied by such Sulfur and Tellurium or Selenium and Tellurium atoms are therefore shown with a single key symbol 307 in the FIG. 3 drawings and in yellow in the above described "MACMOLECULE"™ representation irrespective of the differential alloy composition concept.

Considering the FIG. 3 crystal lattice from a crystallography viewpoint, the lattice structure as represented there may be described with reference to planes and axes (identified in bold-faced type to preclude confusion with drawing element identification numbers herein) in the following manner:

a crystalline cubic lattice 304 located at intersection 306 of the 100, 001 and 010 axes 302, 303, 305, the lattice 304 having lattice initial plane faces 308, 310, 312 received in planes defined by each of the 100-001, 100-010 and 010-001 axis pairs, having sublattice-defining lattice mid planes 314, 316, 318 distal to and parallel with the lattice initial planes 308, 310, 312 respectively and having exterior face planes 320, 322, 324 distal to and parallel with each lattice initial plane 308, 310, 312 and each lattice mid plane 314, 316, 318 when viewed along any of three paths 326, 328, 330 parallel to the 100, 001 and 010 axes, paths orthogonal to the 001-010, 100-010 and 100-001 planes, Gallium atoms 332 located in each sublattice corner of a lattice mid plane lying along the 100 axis 302 parallel with the 001-010 plane, plus Gallium atoms 334 located at each sublattice center in the lattice initial and exterior planes 312, 324 lying along the 100 axis 302 commencing at the 001-010 plane, plus Gallium atoms 336 located at sublattice centers of the initial, the mid and the exterior planes 310, 316, 322 within a first half 337 of the cube lattice 304, the half located parallel to and adjacent the 001-010 plane, along the 100 axis 302, plus Silver atoms 338 located at each sublattice corner in lattice initial and exterior plane faces 320, 324 disposed along the 100 axis 302 parallel to the 001-010 plane, plus Silver atoms 340 located at sublattice centers of the initial, the mid and the exterior planes 310, 316, 322 along the 001 axis within a second half 342 of the cube lattice, a half located parallel to and distal of the 001-010 plane along the 100 axis 302, said Gallium and Silver atoms occupying cation sites in said crystal lattice and comprising an ordered cation sublattice structure, plus one of differential number-quantity, similarly located, Sulfur and Tellurium atoms 343 and differential number-quantity, similarly located, Selenium and Tellurium atoms 343 the differential number-quantity atoms 343 being received in planes intermediate the lattice initial plane, the lattice mid plane and the lattice external plane in mediate planes lying along each of said 100, 001 and 010 axes, the differential number-quantity atoms 343 being disposed in ordered array in random fill anion lattice patterns paralleling each of the 100-010, 100-001 and 010-001 planes. Said differential number-quantity Sulfur and Tellurium atoms and said differential number-quantity Selenium and Tellurium atoms occupying anion sites in said crystal lattice. Said cation sites and said anion sites in said crystal lattice comprising in combination a chalcopyrite lattice structure.

The relationship of the FIG. 3 crystal with respect to the 100, 001 and 010 axes is of course arbitrary but nevertheless helpful for descriptive purposes as it is not easily visualized. The preceding paragraphs of geometric description will of course change if another crystal to axis relationship such as the unit cell description is selected. Several optical parameters of present interest are also represented in the FIG. 3 drawings; these include the directions of maximum and minimum $|n_e-n_o|$ at 347 and 349; the lattice parameter, a, at 351; the c axis or optical axis of the crystal at 353; the anion sublattice at 355 in both FIG. 3b and FIG. 3c and the cation sublattice at 357 in both FIG. 3b and FIG. 3c.

Considering the FIG. 3 drawings from a crystallography viewpoint, persons skilled in the art will probably recognize that the major atoms in the FIG. 3 structure are arranged in a diamond-like pattern and that the differential quantity Sulfur and Tellurium atoms and differential quantity Selenium and Tellurium atoms 343 are as indicated above received in anion locations of this FIG. 3 pattern. This location is in fact believed to be a significant aspect of the present invention since such anion location may be observed to retain the fundamental arrangement of the crystal, i.e., the Silver and Gallium cation atom structure, undisturbed. Moreover since it is this fundamental cation order of a single crystal material which largely determines the optical properties of the material, the FIG. 3 crystal predicts that the resulting chalcopyrite material will have characteristics not radically different from those of the basic alloy, i.e., from the optical characteristics of a Silver Gallium alloy. This is believed to be a significant advantage of the invention in comparison with present day nonlinear optics trends. The cation sub lattices can be seen as every other plane of atoms in FIG. 3b and FIG. 3c.

This undisturbed nature of the FIG. 3 crystal is notable in another respect, since certain of the optical materials heretofore considered for infrared laser device improvement use do not achieve the undisturbed lattice represented in FIG. 3. In particular the Silver Gallium Indium Sulfide and Silver Gallium Indium Selenide materials of considerable current discussion in this art are altered cation sub-lattice materials rather than the presently espoused altered anion materials and therefore provide optical characteristics different from those of the Silver Gallium alloy. In particular it is notable that these materials require larger concentrations to achieve a given change in optical properties and tend to have greater temperature sensitivity. In addition cation size differences make it very difficult to maintain optical uniformity with cation alloying in contrast to the near same sized anion for which optical uniformity is inherently better. This inferior uniformity destroys phase match and accounts for poor performance to date for cation alloy crystals.

FIG. 6 in the drawings shows a representation of the indices of refraction for ordinary and extraordinary waves in a negative birefringence nonlinear uniaxial crystal such as the materials disclosed herein. In the FIG. 6 drawing the outer circle 600 represents the index of refraction encountered by an ordinary ray of any annular disposition when this ray, within the plane relevant to FIG. 6, passes through a crystal of nonlinear uniaxial optical material. Specific values of ordinary ray refractive index no existing along the circle 600, values also along the X and Z axes 602 and 604, are indicated at 606 and 608.

Inscribed within the circle 600 in FIG. 6 is the ellipse 610 representing the index of refraction encountered by an extraordinary ray of any annular disposition when such a ray, within the plane relevant to FIG. 6, passes through a crystal of the present or some other nonlinear uniaxial optical material. As determined by the elliptical shape of the extraordinary ray index representation, the specific index of refraction value encountered by a particular extraordinary ray is dependent on the angular orientation of the ray with respect to some axis of the nonlinear crystal. A specific value of extraordinary ray refractive index is indicated at 612 for the extraordinary ray 614 directed at the angle θ, 616, with respect to the Z axis 604 in FIG. 6; other $n_e$ values are illustrated at 608 and 620 in the drawing. The symbol at 616 in FIG. 6 indicates each represented extraordinary ray refractive index along the ellipse 610 is a function of the angle θ. As indicated at 618, the FIG. 6 drawing is relevant to the negative birefringence case wherein the $n_o$ index is greater than $n_e$. As shown in the above identified Springer-Verlag handbook text a drawing somewhat similar to FIG. 6 excepting for its circle being inscribed within its ellipse can be used for the positive birefringent material case; positive birefringence material is however of primarily academic interest with respect to the present invention since it is incapable of supporting the beam walkoff-free operating characteristics of present invention interest.

The FIG. 6 drawing is of assistance in gaining an appreciation for the significance of walk off free operation of a laser device according to the present invention. Generally such walkoff free operation results from the fact that o-rays propagate in a direction normal to the circle 600 or the spherical surface in FIG. 6 drawing as is represented at 624 and e-rays propagate in a direction normal to the ellipsoidal surface in FIG. 6—as is shown at 626 for a propagation direction θ. Only at θ values of zero and ninety degrees do both rays travel in the same direction. As has been indicated heretofore the achievement of desirable wavelength conversion efficiency in a nonlinear optical device requires the maintenance of closely aligned input and output beams within the nonlinear crystal i.e., requires maintenance of close alignment between the beams 120 and 122 in the FIG. 1 drawing. With closely aligned beams energy transfer between input and output beams of the nonlinear crystal 110 is maximized and highest possible energy conversion efficiency is obtained in the nonlinear crystal. Temperature induced crystal dimension change is however one factor which can disturb this maximum energy coupling relationship in a nonlinear optical crystal. In fact temperature change is often used to tune the birefringence of a nonlinear optical material to a desired operating range.

In summarization it is desired for the o-ray and e-rays in the nonlinear crystal to travel with identical velocities through the crystal. During this travel the paths may have slightly different angular trajectories and the difference angle between these paths is identified as the walkoff angle, (ρ). A mathematical expression relating the quantities ρ, θ, $n_o$ and $n_e$ appears as equation 2.21 in the Springer-Verlag text. At the zero degree and ninety degree or x axis and z axis locations in the FIG. 6 drawing the propagation directions are normal to the surface of the circle representing the refractive index for the ordinary ray and also normal to the ellipse representing the refractive index for the extraordinary ray, at other locations an angular difference exists between these normals. In fabricating a nonlinear chalcopyrite crystal for the present uses it is desired to have the crystal faces disposed at such angle as to allow rays to enter the crystal face along a normal path without refraction and while in the crystal to propagate under phase matched energy exchange conditions. In this geometry a minimum of beam steering occurs simplifying laser characteristic selection.

Even though the quaternary alloys Silver Gallium Selenide Telluride, $AgGa(Se_{(1-x)}Te_x)_2$, and Silver Gallium Sulfide Telluride, $AgGa(S_{(1-x)}Te_x)_2$ are the materials of primary focus in the present invention, a consideration of related nonlinear chalcopyrite materials, materials indeed usable to make the quaternary alloys and also nonlinear chalcopyrite materials in their own right, is informative and provides the basis of several examples presented in this document. These examples comprise what is herein referred-to as the "closely related material" disclosure of the focused-upon quaternary chalcopyrite nonlinear optical materials.

In addition to this "closely related material" based disclosure it is possible to determine certain design properties of the quaternary chalcopyrite alloys of principle focus in the present document (i.e., Silver Gallium Selenide Telluride, $AgGa(Se_{(1-x)}Te_x)_2$ and Silver Gallium Sulfide Telluride, $AgGa(S_{(1-x)}Te_x)_2$ from knowledge of the properties of component materials used to fabricate the quaternary materials. These component materials are in fact the same related nonlinear chalcopyrite materials as are disclosed in the "closely related material" disclosure. The following examples therefore include materials having double significance with respect to the focused upon quaternary materials of the present invention; these "closely related material" are both component materials and are materials of such close relationship as to be usable in predicting the characteristics of the quaternary materials. The first of these example materials is a ternary chalcopyrite alloy, an alloy having a positive birefringence characteristic, i.e., the material Silver Gallium Telluride, $AgGaTe_2$. Other of the quaternary fabrication component materials are disclosed in subsequent examples.

EXAMPLE 1

$AgGaTe_2$

The example 1 $AgGaTe_2$ ternary alloy bears a special significance to the present invention Silver Gallium Selenide Telluride, $AgGa(Se_{(1-x)}Te_x)_2$ and Silver Gallium Sulfide Telluride, $AgGa(S_{(1-x)}Te_x)_2$ quaternary alloys in that it is believed to have heretofore been unavailable in such form and quantity as to allow its characterization by others working in the nonlinear optical art. The success of the present inventors in overcoming this obstacle has therefore been enabling not only with respect to use of the $AgGaTe_2$ alloy itself but has also enabled the significant step of allowing bootstrap characterization of the quaternary alloys Silver Gallium Selenide Telluride, $AgGa(Se_{(1-x)}Te_x)_2$ and Silver Gallium Sulfide Telluride, $AgGa(S_{(1-x)}Te_x)_2$ of present invention interest.

In addition to being a desirable starting component for fabrication of the quaternary chalcopyrite alloys of present focus, the intrinsic properties of the chalcopyrite ternary semiconductor $AgGaTe_2$ indicate it is in its own right a promising nonlinear optical (NLO) material for use in high average power broadly tunable solid state infrared laser systems based on the processes of second harmonic generation (SHG) and optical parametric oscillation (OPO). The positive birefringence characteristic of Silver Gallium Telluride, $AgGaTe_2$ precludes a laser device using such material from achieving advantages achieved with the quaternary negative birefringence materials, however, the material is otherwise similar and believed relevant to the quaternary chalcopyrite materials of present focus. $AgGaTe_2$, for example, provides large second order nonlinear susceptibility $\chi$, [see N. N. Konstantinkova Yu V. Rud', Sov. Phys. Semicond. 23, 1101 (1989)], a large birefringence, a broad infrared transparency range, a competitive thermal conductivity, and desirable mechanical properties. Of these properties, adequate birefringence is arguably of high significance for attaining high average power as it may be used to establish the condition of phase matching to optimize energy transfers between rays in a crystal.

The temperature dependence of the birefringence of $AgGaTe_2$ has been determined for what is believed to be the first time in connection with work toward the present invention. This temperature dependence is approximately one third of that reported for $AgGaSe_2$ and nearly equal to $12\times10^{-6}°K$. across the infrared spectrum. More accurate values are disclosed in the following Table 1 as a function of wavelength and the same data is shown in graphic form in the FIG. 11 drawing. This temperature dependence parameter controls temperature stability and provides a calibration for temperature tuning in an $AgGaTe_2$ embodiment of the crystal 110 in FIG. 1; it is also somewhat useful in predicting birefringence temperature dependence of the quaternary materials $AgGa(S_{(1-x)}Te_x)_2$ and $AgGa(Se_{(1-x)}Te_x)_2$ of consideration in the present invention.

TABLE 1

Temperature Dependence of $AgGaTe_2$ Birefringence

| Wavelength in Microns | $d(\text{delta } n)/dT^{-}/°$ K. |
|---|---|
| 2.0 | $13.4 \times 10^{-6}$ |
| 4.0 | $12.1 \times 10^{-6}$ |
| 6.0 | $11.7 \times 10^{-6}$ |
| 8.0 | $11.4 \times 10^{-6}$ |
| 10.0 | $10.8 \times 10^{-6}$ |

As the $AgGaTe_2$ chalcopyrite crystal structure is non-centrosymmetric, this compound possesses the essential property of a non-zero second order nonlinear susceptibility $\chi$ which can be quite large. As $\chi$ increases rapidly with decreasing band gap, the wavelength conversion efficiency for $AgGaTe_2$ is significantly larger than that of the state-of-of-the-art $CO_2$ laser doubling crystal, $AgGaSe_2$. The band gap for $AgGaTe_2$ is 1.316 electron volt. An experimental value for $\chi$, for $AgGaTe_2$ has not been reported but in the article by A. G. Jackson, M. C. Ohmer, S. R. Leclair, in Infrared Physics & Technology, 38, 233 (1997) $\chi$ is estimated by two methods obtaining the values of 170 pm/V and 220 pm/V. The traditional Miller rule indicates a value of 344 pm/V. Notably even the lowest of these values is a factor of 2.3 larger that that for $AgGaSe_2$. The relevant figure of merit for conversion efficiency for $AgGaTe_2$ is near $(\chi^{(2)})^2/n^3$ where n is the nominal index of refraction at energy levels well below the band gap. This factor has been directly estimated also by Jackson et al. for $AgGaTe_2$ and found to be a factor of three superior to that for $AgGaSe_2$.

Another essential property of chalcopyrite materials for present purposes is the property of birefringence. Birefringence is a result of a uniaxial tetragonal distortion from the underlying diamond-like face-centered cubic structure. This distortion ranges from about zero to ten percent and it is usually described by the c/2a ratio, where c and a designate the lattice constants. The c/2a ratio for $AgGaTe_2$ has been determined to be 1.90 from analysis of x-ray powder patterns, see P. Kistaiah, Y. C. Venudar, K. Sathyanarayana Murthy, Leela Iyengar, and K. V. Krisna Rao, J. Appl. Cryst., 14. 281 (1981). Table III below discloses measured values for the birefringence index of $AgGaTe_2$ as we have determined by measurement in connection with the present invention. The table III values are reasonably close to values hypothesized in the literature including the data reported by R. R. Reddy, Y. Nazeer Ahammed, in Infrared Phys. & Technology, 36, 825 (1995) where an average index of 3.2 is listed without a source reference. The Table III values are also close to the value one calculates using a Moss-like trend relationship as disclosed by Jackson et al. and are near the value of 3.0 calculated using reported reflectance measurements.

A near intrinsic infrared transmission spectra has not been reported for $AgGaTe_2$ as the transmissions of crystals in previous studies, i.e., in B. Tell, J. L. Shay, and H. M. Kasper, Phys. Rev. B, 9, 5203 (1974) and in N. N. Konstantinkova Yu V. Rud', Sov. Phys. Semicond. 23,1101 (1989) were limited by absorption due to native acceptor defects. This extrinsic absorption is so severe that intrinsic absorption has been studied largely by reflectivity, see C. Julien, I. Ivanov, A. Khelfa & F. Alapini, M. Guittard, J. of Materials Science, 31, 3315 (1996). However, the range of transparency of $AgGaTe_2$ can be estimated from reported values of both the room temperature band gap (1.316 electron volts, B. Tell, J. L. Shay, and H. M. Kasper, Phys. Rev. B, 9, 5203 (1974) and C. Julien, I. Ivanov, A. Khelfa &

F. Alapini, M. Guittard, J. of Materials Science, 31, 3315 (1996) and the characteristic frequency of the highest energy fundamental infrared active phonon, E(LO), 205 cm−1. The range can be quite broad, extending from the band edge at 0.91 microns to the onset of two phonon absorption processes, at 24.4 microns (onset of strong absorption). The single surface reflection coefficient (R) has been reported in N. N. Konstantinkova Yu V. Rud', Sov. Phys. Semicond. 23,1101 (1989) to have a nearly constant value of 25% from 1 to 25 microns. It follows from R that the transmission (T) of a non-absorbing uncoated slab of this material is 60% and the average index is nominally 3.0.

Figure 9:
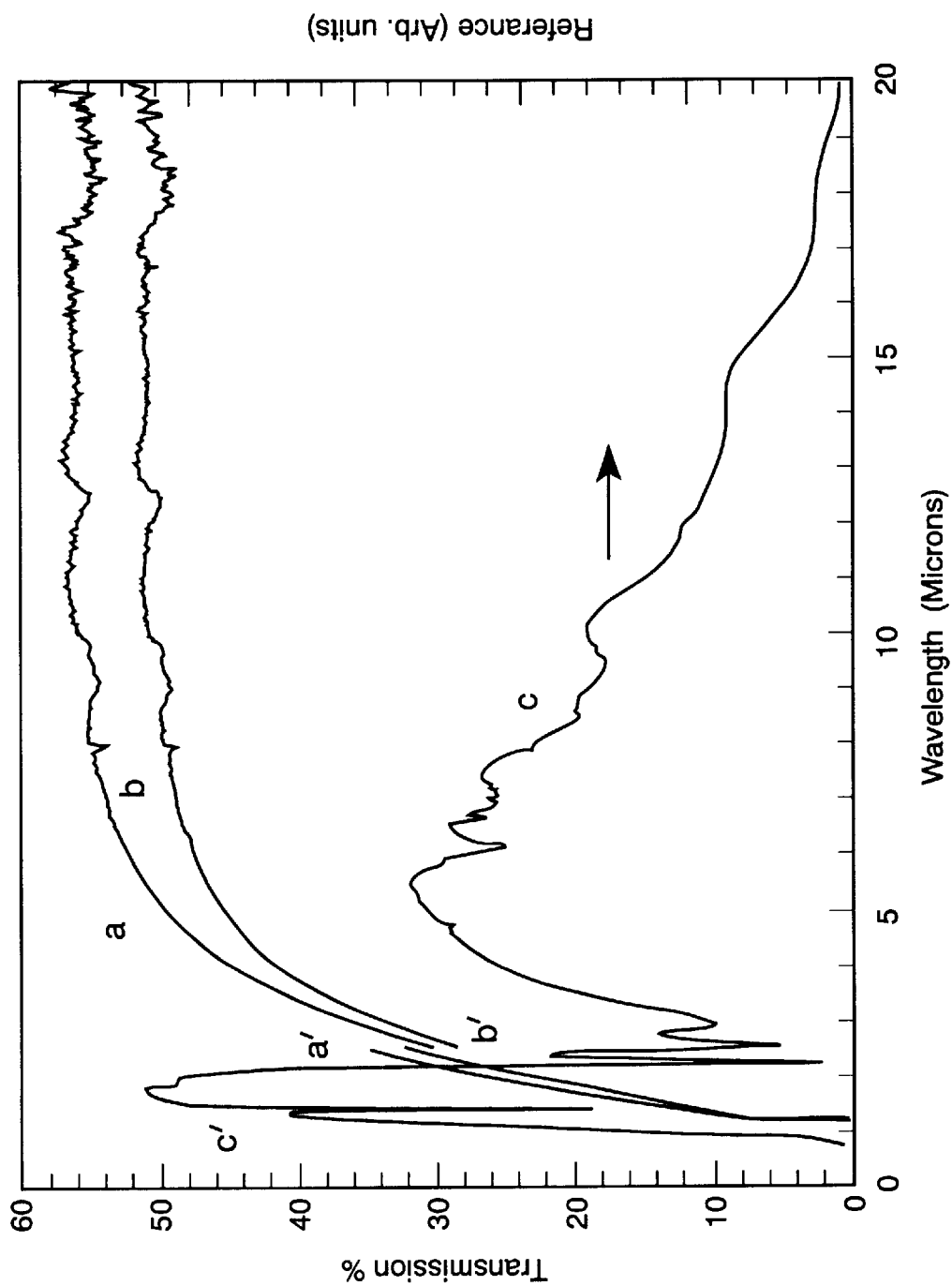
FIG. 9 shows room temperature optical transmission data for two samples of the FIG. 8 $AgGaTe_2$ material under differing conditions.

FIG. 9 in the drawings discloses a family of values measured in connection with the present invention for the infrared transmission spectra of $AgGaTe_2$. In the FIG. 9 drawing the room temperature transmission properties of a sample of 1.21 millimeter thick $AgGaTe_2$ material are represented. In this FIG. the curves a and a' are obtained for the case of o-rays on respectively near infrared and far infrared spectrophotometers. Curves b and b' are similarly obtained for e-rays. Curves c and c' provide the reference spectra for these measurements.

We estimate the thermal conductivity of $AgGaTe_2$ to be 0.8 W/m-°K. by analysis of its band gap trend within this semiconductor family. This value is comparable to the value of 1.1 W/m-°K. for $AgGaSe_2$ reported by J. Donald Beasley in Applied Optics, 33, 1000 (1994). In addition, Tell et. al. cited above report that $AgGaTe_2$ has excellent mechanical properties concluding that it is the most structurally adequate compound studied. Strangely $AgGaTe_2$ has been largely overlooked in comparison to $AgGaSe_2$, considering that in principle, it has superior intrinsic optical properties and comparable mechanical and thermal properties. The properties of $AgGaTe_2$ to be reported herein include the birefringence, the index of refraction, the range of transparency, and the temperature dependence of the band gap as well as native defect related sub-band gap photoluminescence and electrical transport properties. These properties define the potential of this material for the wavelength conversion processes of OPO and SHG.

The modern samples reported upon here may be grown by unseeded and seeded horizontal dynamic gradient freeze according to the process reported in the U.S. Pat. No. 5,611,856 of Schunemann et al. A transparent furnace is utilized to facilitate seeding and low thermal gradients and growth rates typical of those appropriate for other difficult to grow chalcopyrites are exploited, see also Peter G. Schunemann and Thomas M. Pollak, MRS Bulletin, 7, 23 (1998). All samples are considered as grown and three samples from two crystal growths are considered extensively; first, an unoriented sample (#2A) of dimensions $5.1 \times 5.1 \times 8.3$ mm³; second, an oriented sample (#4A) of dimensions $6 \times 5 \times 2.16$ mm³, where the c-axis is parallel to the long dimension and lying in the surface plane; and third, sample #4C, a pie-slice shaped prism with an apex angle of 28.2 degrees where the c-axis is parallel to the prism edge defining the apex. One early sample subsequently was fabricated into X-ray powder pattern samples. All samples are optically polished and silvery in appearance. The birefringence measurements are obtained in a two step process using sample #4A.

Initial sample measurements are taken at the thickness 2.158 mm+−001 and subsequently thinned to a thickness of 1.210 mm +/−0.001 and the measurements repeated. This procedure is used so that the order of the peaks in the polarization interference is properly assigned. The apex angle is chosen to optimize the accuracy of the index measurement for an index of nominally 3.0. For transport measurements, gold wires are indium soldered to the four corners to provide Hall effect samples in the Van Der Paaw geometry. The reported fitting parameters for the Sellmeier expressions are obtained using a nonlinear fitting routine available in the software application Origin™, where the fitting function is user definable.

X-Ray Data $AgGaTe_2$ is generally considered to have the chalcopyrite crystal structure, however, information regarding the diffraction pattern expected from $AgGaTe_2$ powder samples at room temperature and atmospheric pressure is not known to be reported in the literature. Therefore, the x-ray diffraction pattern obtained at room temperature from $AgGaTe_2$ using the Cu Kα line is reported in Table II below. The angles and relative intensities of ten of the thirteen lines identified in this data agrees well with that expected in a chalcopyrite structure. A reasonably strong line (having relative intensity of 8 out of 100) at a d-spacing of 1.811 and two weaker lines at 2.988 microns and 1.581 microns are not, however, identifiable with either the reported or calculated spectra. Nevertheless, all strong lines (of greater than 20 relative intensity) match the anticipated chalcopyrite crystal structure well. The lattice parameters using the data in Table II are calculated to be a=6.2786 angstroms and c=11.9637 angstroms for a c/a ratio of 1.905. The disclosed value for c/2a agrees to within 0.3% of the previously reported values. Eleven lines in the powder pattern are unambiguously indexable in the chalcopyrite pattern.

TABLE II

Calculated and Experimental Diffraction Pattern for $AgGaTe_2$

| hkl | d | d(Exp) | 2θ | 2θ(Exp) | I(Exp), I(Theo) |
|---|---|---|---|---|---|
| 101 | 5.54 | | 15.96 | | 0, 3 |
| 112 | 3.559 | 3.562 | 25.02 | 25.00 | 100, 100 |
| 103 | 3.354 | 3.363 | 26.58 | 26.50 | 2, 7 |
| 200 | 3.14 | 3.143 | 28.42 | 28.40 | 2, 1 |
| | | 2.988 | | 29.9 | 1, 0 |
| 211 | 2.733 | 2.734 | 32.76 | 32.75 | 3, 13 |
| 213 | 2.292 | | 39.31 | | 0, 2 |
| 220 | 2.22 | 2.222 | 40.63 | 40.60 | 27, 25 |
| 204 | 2.16 | 2.166 | 41.83 | 41.70 | 59, 45 |
| | | 1.897 | | 47.95 | 8, 0 |
| 301 | 2.062 | | 43.91 | | 0, 4 |
| 312 | 1.884 | 1.888 | 48.31 | 48.20 | 18, 40 |
| 303 | 1.851 | 1.857 | 49.21 | 49.05 | 2, 1 |
| 215 | 1.816 | | 50.25 | | 0, 1 |
| 116 | 1.811 | 1.819 | 50.39 | 50.15 | 11, 11 |
| | | 1.581 | | 58.35 | 1, 0 |
| 321 | 1.723 | | 53.14 | | 0, 2 |
| 323 | 1.595 | | 57.81 | | 0, 4 |
| 400 | 1.57 | 1.568 | 58.81 | 58.90 | 4, 12 |
| 411 | 1.511 | 1.496 | 61.36 | | 0, 2 |
| 332 | 1.436 | | 64.91 | | 0, 7 |
| 008 | 1.488 | | 62.43 | 62.05 | 2, 2 |
| 325 | 1.406 | | 66.52 | | 0, 2 |
| 316 | 1.403 | | 66.64 | | 0, 8 |
| 307 | 1.32 | | 71.49 | | 0, 1 |
| 415 | 1.283 | | 73.87 | | 0, 2 |
| 424 | 1.27 | | 74.75 | | 0, 13 |
| 431 | 1.249 | | 76.22 | | 0, 2 |

Birefringence The birefringence of $AgGaTe_2$ has been directly measured using the polarization interference method reported in D. W. Fischer and M. C. Ohmer, P. G. Schunemann and T. M. Pollak, J. Appl. Phys., 77,5942 (1995) and the optimally oriented sample #4A. This data is reported here in what is believed to be the first time in patent format. The birefringence is found to range from a near band edge value of 0.038 at 1.3 microns to a value of 0.017 at 15 microns. The data is plotted in FIG. 7 herein and listed in Table II. It should be noted that these values may represent a lower bound since free carriers of either sign can lower the value significantly, as is reported in D. W. Fischer and M. C. Ohmer and J. E. McCrae, J. Appl. Phys., 81, 3579 (1997). A Sellmeier-like dispersion equation is used to fit experimental values, following the procedure disclosed by Gorachand Ghosh, in applied Optics, 37, 1205 (1998) where the birefringence (b) is given by, $$b=I\lambda^2/(\lambda^2-C')+J\lambda^2/(\lambda^2-F'),\qquad(12)$$

and $\lambda$ is the wavelength in microns. This physically realistic functional form is usually chosen as the parameters C' and F' parody the parameters C and F for the Sellmeier fit to the corresponding data for the average index of refraction. Additionally, they can be approximately correlated respectively with the band gap energy and the energy of the onset of phonon absorption. The fitting values for the parameters, I, C', J, and F' are found to be respectively, 0.01939, 0.73191, 0.11241, and 7227.84. The oscillator energy equivalent of C', ($E_o=1.2398/C'^{1/2}$), is 1.449 electron volt and the corresponding phonon oscillator wavelength, ($F'^{1/2}$), is 85 microns. Ghosh in the afore cited reference relates $E_o$ directly to the band gap. However S. H. Wemple and M. Didomenico, in Phys. Rev. B, 3,1338 (1971), while agreeing that it is linearly related, indicate that the relationship is given by $E_o=1.5\ E_G$ or $E_G=0.97$ electron volt. In this case, Ghosh's procedure is closer to the actual value of 1.356 electron volt. The fit of Equation 12 to our data is shown in FIG. 7.

Figure 7:
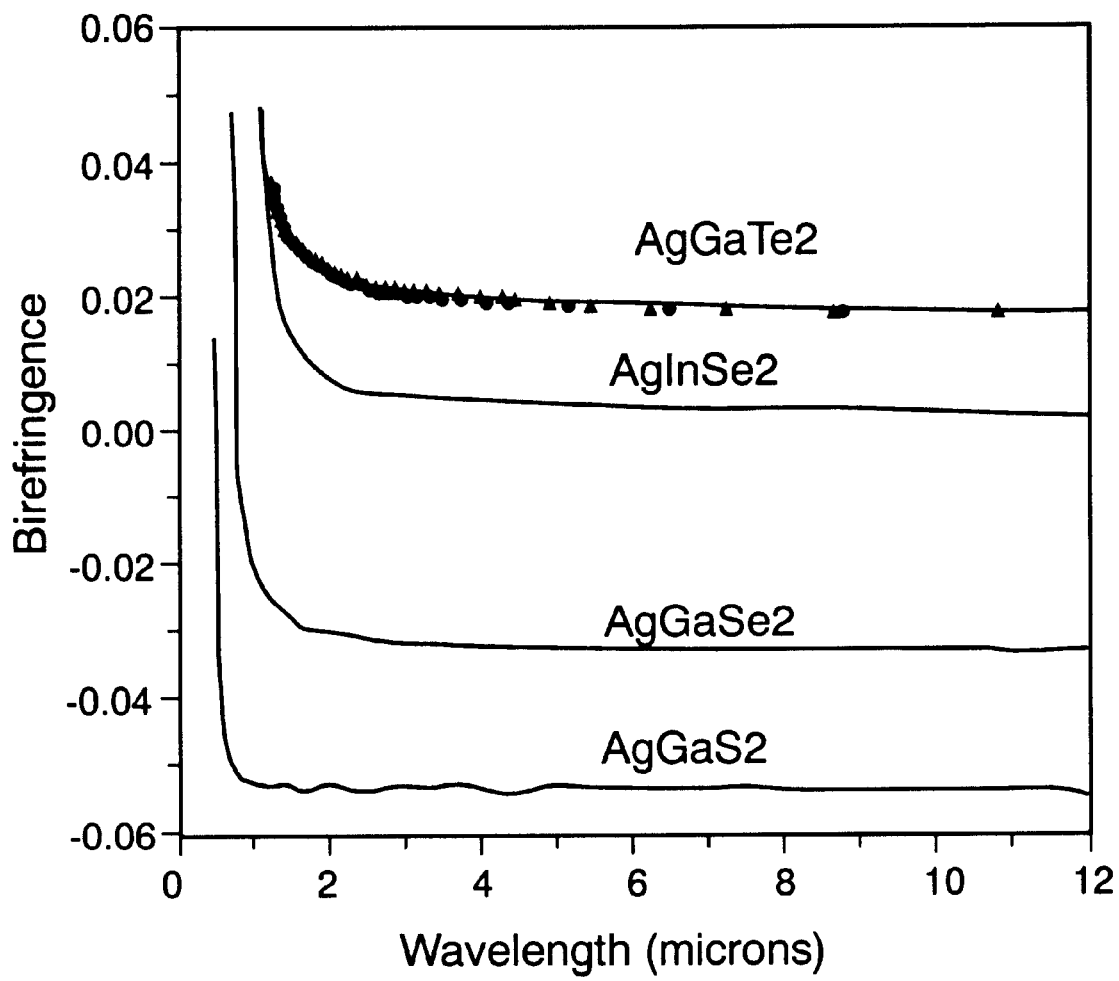
FIG. 7 shows the relationship between birefringence and wavelength for four chalcopyrite materials relating to the quaternary alloys of the present invention.

FIG. 7 also compares the birefringence of similar members of the chalcopyrite family. As this FIG. 7 comparison shows, $AgGaSe_2$ and $AgGaS_2$ have large negative birefringences in the infrared wavelengths and they are broadly phase matchable. The birefringence of $AgInSe_2$ is positively birefringent for all wavelengths but the magnitude is too small to be useful for phase matching. Our measurements indicate that $AgGaTe_2$ is also positively birefringent for all wavelengths as is discussed later and its birefringence is about a factor of 4 larger than that of the $AgInSe_2$ material discussed in example 4 below. The $AgGaTe_2$ birefringence is nearly exactly equal to that of CdSe, its near binary analog which is phase matchable. In order to confidently assess whether $AgGaTe_2$ is phase matchable, not only the birefringence but the dispersion must be known accurately.

Refractive Index

The extraordinary and the ordinary refractive indices $n_e$ and $n_o$ of $AgGaTe_2$ listed in Table III are directly measured between wavelengths of 3.0 to 5.0 microns by the minimum deviation angle method disclosed by David E. Zelmon, David L. Small, and Ralph Page, in Applied Optics, 37, 4933 (1999). Sample #4C was used for these measurements. The sign of the birefringence is established by analyzing the polarization of the refracted beams. This is the first patent document report of these parameters for $AgGaTe_2$, although an average value of 3.2 has, as noted above, been previously listed in a compendium of indices without a source reference, see R. R. Reddy, Y. Nazeer Ahammed, Infrared Phys. & Technology, 36, 825 (1995).

Parenthetically it may be noted that the believed first patent reporting of Table III values in the present document, and the similar first patent reporting of other characteristics of the $AgGaTe_2$ material herein, are of notable significance with respect to the focused-upon quaternary alloys Silver Gallium Selenide Telluride, $AgGa(Se_{(1-x)}Te_x)_2$, and Silver Gallium Sulfide Telluride, $AgGa(S_{(1-x)}Te_x)_2$ in a somewhat indirect but nevertheless important sense. Applicants believe for example that they are the first to have available for detailed measurement such quantities of the ternary chalcopyrite $AgGaTe_2$ material as can provide the array of detailed characteristics of this material disclosed herein. Heretofore, therefore, it has been impossible to accomplish a "closely related material" disclosure, such as the present, for any purpose including establishment of a relationship with the focused-upon quaternary chalcopyrite alloys Silver Gallium Selenide Telluride, $AgGa(Se_{(1-x)}Te_x)_2$, and Silver Gallium Sulfide Telluride, $AgGa(S_{(1-x)}Te_x)_2$ i.e., impossible because usable quantities of the ternary "closely related material" were not heretofore available for characterization.

TABLE III

Extraordinary and Ordinary Indices of Refraction for $AgGaTe_2$ in the Mid-Infrared

| U5 (microns) | $n_e$ | $n_o$ | $b = n_e - n_o$ |
|---|---|---|---|
| 3.0 | 3.00473 | 2.98592 | .01881 |
| 3.5 | 2.99750 | 2.98035 | .01715 |
| 4.0 | 2.99337 | 2.97618 | .01719 |
| 4.5 | 2.98939 | 2.97335 | .01604 |
| 5.0 | 2.98677 | 2.97065 | .01612 |

The data set in Table III is based on early, somewhat less than optimum quality, $AgGaTe_2$ crystals. The dispersion characteristic of the material must be accurately known to determine phase matching angles. The directly measured b is 15–20% higher that that determined by the less accurate method of differencing the indices but is nominally in good agreement. It should be noted that these measurements were obtained on two different samples and the analysis in either case ignored free carrier, rotary power and polarization sensitive precipitation scattering effects. As noted in the published article of D. W. Fischer, M. C. Ohmer and J. E. McCrae appearing in the Journal of Applied Physics Volume 81, at page 3579 (1977) free carriers of either type can decrease the birefringence of a given sample.

Sellmeier expressions for the indices may be obtained using a two step method employing both the index and birefringence data, the n and b data. First, a Sellmeier fit to the average index data from 3–5 microns is obtained using data listed in Table III. The first estimate for the parameters is based on a knowledge of the band gap energy, the characteristic phonon energies and the experimental indices in order to provide the usual somewhat physically realistic expression. A non-physical highly accurate analytical expression obtained by fitting our b values from nominally 1–15 microns and our initial Sellmeier for the average index may be used to construct a data file for $n_e$ and $n_o$. This constructed file may then be used to obtain the Sellmeier expressions given in Equations 13 and 14. The resulting parameters are disclosed in Table IV below.

$$n_e^2=A_e+B_e\lambda^2/(\lambda^2-C_e)+D_e\lambda^2/(\lambda^2F_e)\qquad(13)$$

$$n_o^2=A_o+B_o\lambda^2/(\lambda^2-C_o)+D_o\lambda^2/(\lambda^2F_o)\qquad(14)$$

TABLE IV

Parameters for Three Term Sellmeier Expressions for $AgGaTe_2$

| Parameter | $n_e^2$ | $n_o^2$ |
|---|---|---|
| A | 8.63014 | 8.57181 |
| B | 0.31139 | 0.2582 |
| C | 2.28616 | 2.38844 |
| D | 1.61668 | 1.5502 |
| E | 961 | 961 |

Figure 8:
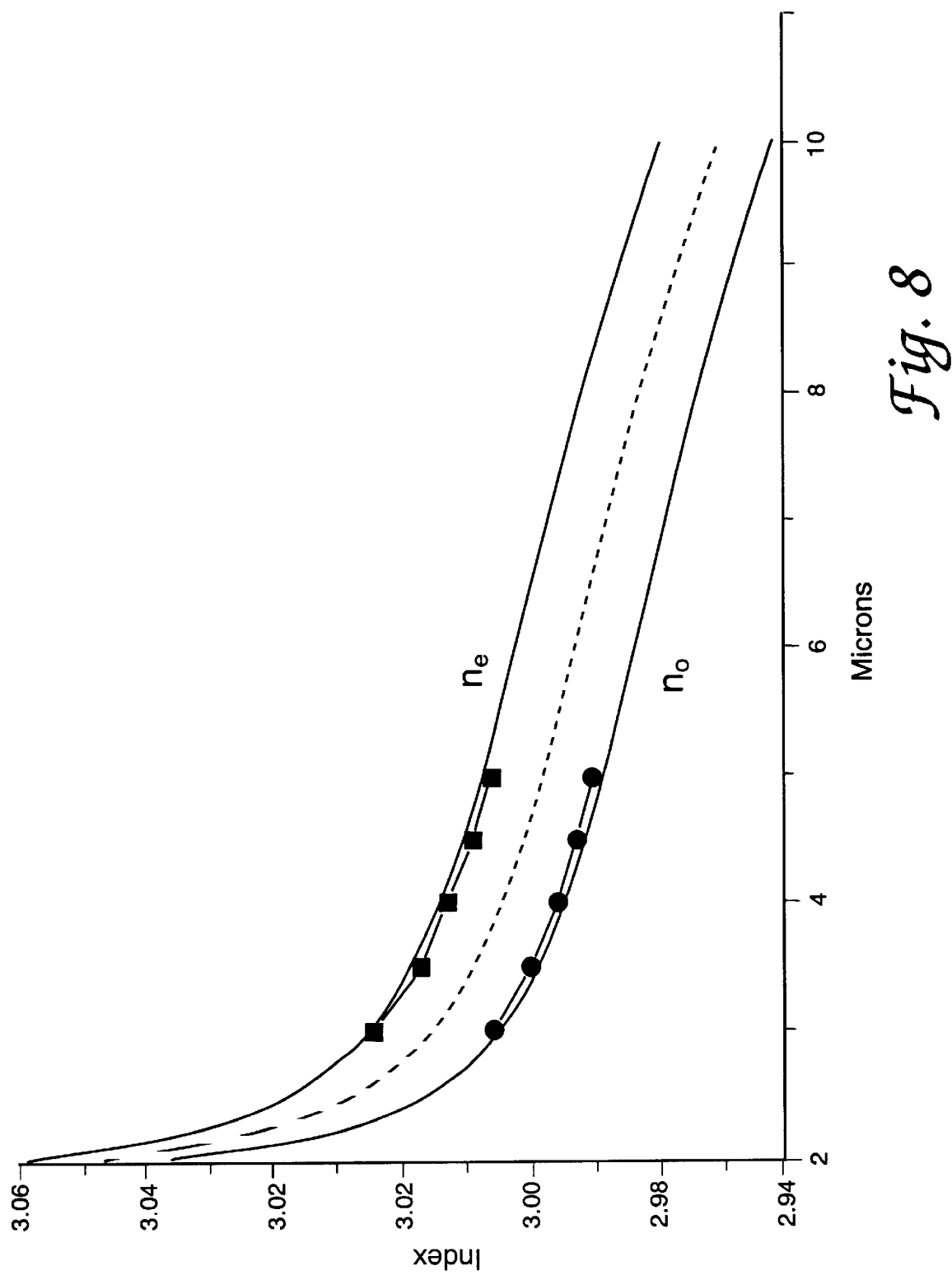
FIG. 8 shows experimental $n_e$ and $n_o$ refraction indices for $AgGaTe_2$, a material relevant to the present invention quaternary chalcopyrite alloys.

Equations 13 and 14 are also shown plotted in FIG. 8 herein. The index data from Table II are also plotted in FIG.

8. The slightly smaller birefringence in the index data mentioned before is apparent. The average index from our Sellmeier expression is also shown in FIG. 8 as a dashed line. FIG. 8 shows that the indices constructed from the experimental birefringence and the Sellmeier expression for the average index are described very well by equations 13 and 14 as the overlay is quite precise.

Transmission and Absorption

The spectral transmission curves for an $AgGaTe_2$ sample #4A are shown in FIG. 7. The thickness of the sample is 1.21 mm. The expected extremely broad transmission range spectra was obtained. In this sample the peak transmission is 56% for o-rays, a value within 4% of that expected for no optical loss for a material with an index 3.0. The range nominally extends from 1 to 21 microns from the band edge to the onset of two phonon absorption. A band tail extends for 5–6 microns beyond the band edge for both polarizations, this is evidence that the transmission of the sample is limited by deep levels as is typical for compound semiconductors. This defect related sub-bandgap near edge absorption is observed in all of our $AgGaTe_2$ samples. This absorption band does not freeze out, persisting instead to low temperatures. The sub-bandgap near edge absorption band for sample #4A obtained at a temperature of 4.5 °K. is analyzed. Deconvolution occurs into two Gaussian indicated peak positions at 0.946 and 1.00 electron volts where the peak at 0.946 electron volts was the most intense. Even though the initial crystals studied have far from optimum crystal quality, their transmission spectra indicates that it should be possible to produce crystals with a remarkably broad transmission range with a near intrinsic transmission.

FIG. 9 in the drawings shows the measured room temperature transmission properties of a sample of 1.21 millimeter thick $AgGaTe_2$ material. In this FIG. the curves a and a' are obtained for the case of o-rays on respectively near infrared and far infrared spectrophotometers. Curves b and b' are similarly obtained for e-rays. Curves c and c' provide the reference spectra for these measurements.

By accident the $AgGaTe_2$ sample #4A and another sample, sample #2A have different thermal histories. Sample #2A experienced rapid cooling during the final growth step while sample #4A cooled more slowly. Near infrared imaging of sample #2A does not show finely divided second phase optically scattering precipitates as are typically observed in $AgGaSe_2$. However, the usual precipitate described by G. C. Catella and D. Burlage in Materials Research Society (MRS) Bulletin, 23,28 (1998) is observed in sample #4A. As this precipitate is the source of scattering loss, it may partially explain the low transmission of sample #4A. Defect related sub-bandgap near edge absorption is observed in our $AgGaTe_2$ samples as shown in FIG. (3) for sample #4A. The FIG. 4 data is taken at a temperature of 4.5K. After baseline subtraction, a Gaussian is fitted to the FIG. 3 data peak, and then subtracted from the parent spectrum. The new spectrum reveals an additional peak, which is also fitted to a Gaussian and subtracted. The Gaussians, the spectrum, and both subtracted spectra are shown in FIG. (3). The peaks have energies of 0.946 electron Volt and 1.00 electron Volt. This data indicates the transmission of our samples is extrinsically limited by native defects.

The optical and electrical properties of compound semiconductors are generally controlled by native point defects such as vacancies or anti-sites, and the chalcopyrite semiconductors are no exception, particularly with regard to cation vacancies. This is due to a size mismatch between the two cations in the ordered cation sub-lattice. These defects are usually donors or acceptors which can act as absorbing centers via photoionization and they are the source of thermally activated carriers that cause free carrier absorption.

The temperature dependence of the bandgap may be determined from an analysis of the band gap absorption edge. Specifically, the second derivative of the band edge may be taken, and the peak marking the edge's point of inflection then used as an indicator of the band edge. This estimate of the bandgap is found to vary from 0.99 electron volt at room temperature to an extrapolated value of 1.10 electron volt at zero degrees Kelvin (K). Typically, due to absorption by deep levels, the band gap obtained by analysis of the absorption edge underestimates the actual gap as is true in this case. Electroreflectance measurements as disclosed in B. Tell, J. L. Shay, and H. M. Kasper, Phys. Rev. B, 9, 5203 (1974), for instance, indicate that the actual room temperature gap is 1.316 electron volt. However, such analysis does yield an accurate measure of the relative change of the bandgap with temperature. The average dE/dT is found to be $-4.7 \times 10^{-4}$ electron volt/°K. in the temperature range from 150° K. to 300° K. This compares favorably with the previously reported value of N. N. Konstantinkova Yu V. Rud' in Sov. Phys. Semicond. 23,1101 (1989) of dE/dT of $-3.6 \ 10^{-4}$ electron volt/°K. over the larger range of 80° K. to 350° K.. For such a range, we would obtain a similar value as a result of saturation. This parameter is of interest as it largely controls the temperature dependence of n and the b through the band gap dependence of the first term of Equation 12 and the second term in Equations 13 and 14. Fits can be made to both the Varshni[19] and Cody[20] analytical expressions, the expressions disclosed in Y. P. Varshni, Physica 34, 149 (1967) and in G. D. Cody, in Hydrogenated Amorphous Silicon, edited by J. I. Pankove, Semiconductors and Semimetals vol. 21, Pt. b (Academic, New York, 1984), Chap. 2, pp. 11–79. The Varshni expression given below provides the best fit.

$$E_g(T)=1.20-(0.001T^2)/(T+607) \qquad (14)$$

In this equation $E_g(T)$ is the band gap in electron volt and T is the absolute Kelvin temperature.

Photoluminescence Data

The low temperature photoluminescence (PL) of $AgGaTe_2$ has been investigated using the technique reported by H. M. Hobgood, T. Henningsen, R. N. Thomas, and R. H. Hopkins, M. C. Ohmer, W. C. Mitchel, D. W. Fischer, S. M. Hegde, and F. K. Hopkins in J. Appl. Phys. 73, 4030 (1993). Although this is believed a direct gap material, band to band photoluminescence is not observed in our samples. However, sub-band gap photoluminescence is observed and typical spectra are shown in FIG. 10 herein. In these initial measurements polarization of the emission is not analyzed nor is the polarization of the exciting laser controlled. Additionally sample 2A is oriented at an unknown arbitrary angle. Sample 4A is oriented such that the c-axis is parallel to the plane of the surface of the sample. This sub-band gap photoluminescence is spectrally quite broad, peaking at 0.8 electron volt and similar in appearance to that observed in many other compound semiconductors. As the crystals are nominally undoped and grown from ultra-pure materials, this photoluminescence is most likely due to native defects such as vacancies or antisites typically observed in other chalcopyrites.

Transport Data

Sample #2A#2, of dimensions $5 \times 5 \times 2.5 \ mm^3$ provides temperature dependent Hall effect data. Sample #2A#2 is cut from sample #2A, a sample having the transmission shown in FIG. 9. This analysis indicates the sample is p-type as grown; this has been observed previously as is reported by B. Tell, J. L. Shay, and H. M. Kasper in Phys. Rev. B, 9, 5203 (1974) and also by N. N. Konstantinkova and Yu V. Rud' in Sov. Phys. Semicond. 23,1101 (1989). The carrier concentration, resistivity, and mobility at 300° K. are respectively, $1.4 \times 10^{14}$ cm$^{-3}$, 3800 ohm-cm, and 11 cm/Vs. Analysis of the high temperature region for both the resistivity and the carrier concentration curves provides an activation energy of 0.30 electron volt. The low temperature region shows significant hopping conduction. B. Tell, J. L. Shay, and H. M. Kasper in Phys. Rev. B, 9, 5203 (1974) reported that their AgGaTe$_2$ crystals as grown varied from moderately conducting p-type to high resistivity p-type with carrier concentration to $10^{17}$ cm$^{-3}$ and Hall mobilities in the range of 20–40 cm/Vs. N. N. Konstantinkova and Yu V. Rud' in Sov. Phys. Semicond. 23,1101 (1989) report, for as grown materials, p-type behavior characterized by an activation energy of 0.15 electron volt in samples with a carrier concentration in the range of $1 \times 5 \times 10^{13}$ cm$^{-3}$ and Hall mobilities in the range of 5–8 cm/Vs. They also report significant hopping. All results are in reasonable agreement except with regard to activation energy. This may indicate that different deep native acceptor defects are being observed or the growth processes have introduced different p-type impurities. The crystals in all cases are grown from stoichiometric melts formed from elemental starting materials. However, Konstantinkova and Rud used graphite coated silica boats while our crystals are grown in pyrolytic Boron nitride-coated graphite boats.

AgGaTe$_2$ Phase Matching at Room Temperature

Utilizing Equations 13 and 14 for the indices of AgGaTe$_2$, the possibility of Type I phase matching for the processes of SHG and degenerate OPO generation can be investigated under a plurality of different conditions. These conditions include investigation at room temperature, at elevated temperature and for AgGaTe$_2$—AgGaSe$_2$ mixed crystals at room temperature. It is found that AgGaTe$_2$ does not phase match at room temperature for the usual CO$_2$ and two micron pump lasers. This is because the birefringence is not large enough to compensate for the dispersion predicted. For this case for SHG of 10.6 microns, birefringence is 0.0176 and a value of 0.022 or more is required for phase matching, a shortfall of 0.0044 or 25%.

Phase matching is however realizable in AgGaTe$_2$ at slightly elevated temperatures i.e., through use of the mechanisim of temperature tuning. This is because the magnitude of the birefringence generally increases significantly with temperature for both the cases of positive and negative birefringence. This characteristic has been described by M. C. Ohmer and R. Pandey in MRS Bulletin, 23,16 (1998) and by N. P. Barnes, D. J. Gettemy, J. R. Hietanen, R. A. Iannini in Appl. Opt. 28, 5162 (1989). Temperature tuning to obtain the necessary birefringence has been previously exploited by Andreev et. al. as is reported in the article by Y. M. Andreev, A. N. Morozov, A. V. Sosin, and G. S. Khmelnitskii, Sov. J. Quantum. Electron. 14, 1024 (1984) and by Bahr et. al. as reported in an article by G. C. Bhar, S. Das, and U. Chattergee, P. K. Datta, and Yu. M. Andreev in App. Phys. Lett. 63,1316 (1993). The magnitude of db/dT for AgGaTe$_2$ is found to be a value of $+11 \times 10^{-6}$/° K. at 3.39 microns. Using this value indicates that AgGaTe$_2$ will phase match at 10.6 microns at a temperature of 300° C.

The fundamental optical properties of AgGaTe$_2$, a nonlinear optical semiconductor are therefore reported here. These properties include birefringence, indices of refraction, infrared transmission, and the temperature dependence of the band gap. The average index for wavelengths greater than several microns is found to be 3.0. The birefringence is found to be rather large and to range from a near band edge value of 0.038 at 1.3 microns to a value of 0.017 at 15 microns. Additionally, native defect related sub-band gap absorption, photoluminescence and electrical transport properties have been studied in nominally undoped p-type crystals. An activation energy associated with these defects is determine to be 0.37 electron volt and the corresponding photoluminescence and absorption data shows respectively a broad asymmetric emission band centered at 0.8 electron volt and two bands at 0.95 electron volt and 1.01 electron volt, the former being the most intense. The measured properties are utilized to assess the potential of AgGaTe$_2$ for the wavelength conversion processes of optical parametric oscillation and second harmonic generation.

Figure 11:
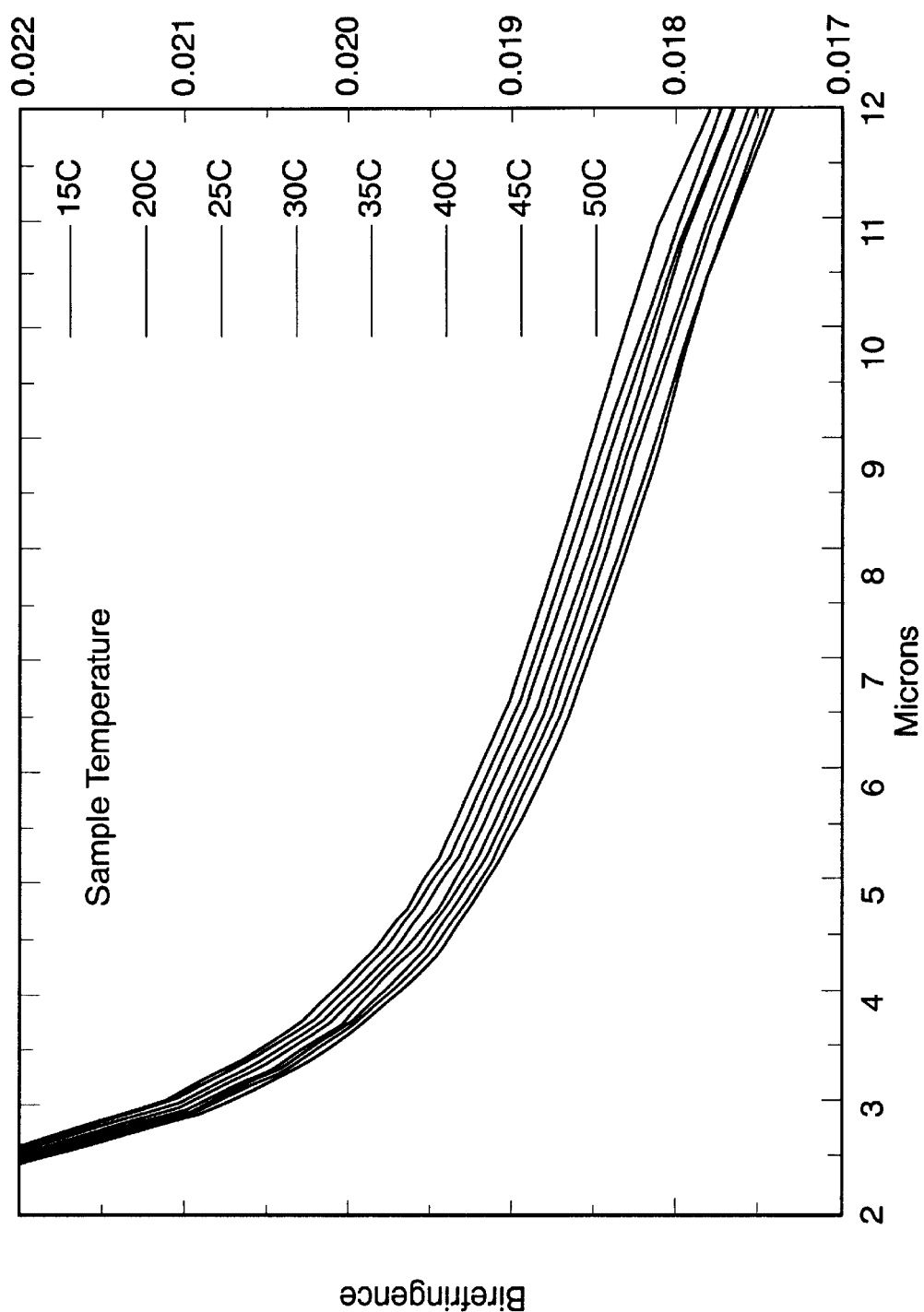
FIG. 11 shows the relationship between birefringence, wavelength and temperature for the chalcopyrite material $AgGaTe_2$, a material usable both in a wavelength changing element and as a component material for other birefringent chalcopyrite materials considered herein.

Room temperature wavelength versus refraction index curves for the AgGaTe$_2$ material, are shown in FIG. 11$a$ of the drawings herein. These curves relate somewhat to FIG. 2 in the drawings and illustrate material properties from a different perspective. One disadvantage of the AgGaTe$_2$ material for present purposes is for example apparent in the FIG. 10$a$ curves in that second harmonic generation operation is not possible at the wavelength of the 10.6 micron carbon dioxide laser line; this is because of the excessively large dispersion of the index of refraction occurring in FIG. 10$a$ and the fact this cannot be compensated since the birefringence is too small, $\chi \approx 170$ pm/v. The improvement achieved through inclusion of a near optimum amount of Selenium to form a quaternary alloy Silver Gallium Selenide Telluride is apparent in FIG. 11$b$ and is discussed under the heading of example 6 below.

EXAMPLE 2

AgGaSe$_2$

Fabrication of a first one the two quaternary alloys of present focus, i.e., fabrication of Silver Gallium Selenide Telluride, AgGa(Se$_{(1-x)}$Te$_x$)$_2$, may in fact commence with the above disclosed AgGaTe$_2$ ternary chalcopyrite material as a first component and use the ternary chalcopyrite AgGaSe$_2$ material as a second component. Alternately such fabrication can also commence with the four component elements of the quaternary AgGa(Se$_{(1-x)}$Te$_x$)$_2$ alloy. In either of these instances, the horizontal pulling method disclosed in the above identified U.S. Pat. No. 5,611,856 is deemed an appropriate quaternary material fabrication process. In view of the former or ternary alloy possible origination of the quaternary alloys, a discussion of the ternary alloy, AgGaSe$_2$, component as a part of the "closely related materials" disclosure appears appropriate. The present Example 2 is used for this purpose.

Several of the previously discussed drawings in the present patent document are relevant to multiple chalcopyrite materials and therefore are also either generally or specifically descriptive of this present example second component ternary alloy, AgGaSe$_2$ material. This multiple relevance is appropriate for example to the FIG. 1 use apparatus drawing (especially since AgGaSe$_2$ is noted to be the current state of the art wavelength changing material for use in FIG. 1 type apparatus). The crystal structure shown in FIG. 3 is also relevant to the second ternary, AgGaSe$_2$, and the birefringence properties discussed in connection with FIG. 6 in the drawings also have relevance to this material. Moreover the birefringence and wavelength relationships shown in the FIG. 7 drawing also include curves relevant to this second ternary, AgGaSe$_2$, alloy.

A plurality of additional properties of the second ternary, AgGaSe$_2$, alloy are also disclosed in the above referred-to Springer-Verlag handbook of optical materials, see especially section 3.1.23, the seven other references to this material in the "subject index" of the Springer-Verlag handbook and the identified publication "references" disclosed commencing at page 197 of the 1991 Springer-Verlag handbook text. Further properties of the $AgGaSe_2$ material and its growth are to be found in articles appearing in the above identified "MRS Bulletin", Volume 23 number Jul. 7, 1998. As is implied by these recitations of properties, the $AgGaSe_2$ chalcopyrite alloy is also a viable material in its own right for end use in a nonlinear optical crystal laser device.

Notably the $AgGaSe_2$ alloy provides negative birefringence characteristics and is therefore a more significant material for employment, as either an end use crystal or as a component material in present invention wavelength changing crystals than are some other materials. The band gap for $AgGaSe_2$ is 1.83 electron volts; this is in comparison with the band gap of 1.316 electron volts for the above recited example 1 $AgGaTe_2$ material. A thermal conductivity value of 1.1 W/m-°K. has been reported for $AgGaSe_2$ by J. Donald Beasley in Applied Optics, 33, 1000 (1994). The temperature differential of birefringence, db/dT, for $AgGaSe_2$ has been reported by N. P. Barnes, D. J. Gettemy, J. R. Hietanen, R. A. Iannini in Appl. Opt. 28, 5162 (1989) to have a value of $-31 \times 10^6/°$ K. at 3.39 microns. Other properties of $AgGaSe_2$ are also reported by J. L. Shay and J. H. Wernick in *Ternary Chalcopyrite Semiconductors: Growth, Electronic Properties, and Applications* (Pergamon, New York, 1975). Additional data regarding characteristics of the $AgGaSe_2$ alloy, including the source data of the FIG. 7 curve for this alloy, are available from the earlier work of Boyd et al. as published in G. D. Boyd, H. M. Rasper, J. H. McFee and F. G. Storz Institute of Electrical and Electronic Engineers Journal of Quantum Electronics 8 (12) (1972) page 900.

The phase matching angle for $AgGaSe_2$ is 54.4 degrees for a 10.6 micrometers pump and its $\chi_{36}^{(2)}$ is 66 pm/V; these values are reported in the Springer-Verlag Handbook of Nonlinear Optical Crystals. This angle of 54.4 degrees is, however, considerably smaller than the ideal phase matching angle of 90 degrees for present invention purposes. The value of the angle θ for a 19 percent Tellurium addition to this $AgGaSe_2$ is, however, a much better value of 86.2 degrees. The figure of merit for conversion efficiency for the 19 percent Tellurium composition is, moreover, found to be a factor of 1.5 greater than that of $AgGaSe_2$, considering only the larger angle θ; its $\chi_{36}^{(2)}$ is also larger as it has a smaller band gap. These considerations suggest the addition of a selected amount of Tellurium to the $AgGaSe_2$ material of the present example can be of significant benefit for present invention purposes. This benefit is considered in greater detail in Example 6 below.

To conclude this example, the conversion efficiency for $AgGaSe_2$, the most widely used infrared nonlinear optical crystal, the crystal presently considered to be the state-of-the-art $CO_2$ laser doubling crystal, is limited since its birefringence is not optimal and its nonlinear properties are also sub-optimal. This results in a phase matching angle which does not use effectively the available nonlinearity, causes excessive walk-off of the signal and pump beams and provides a low conversion efficiency in view of its $\chi^2$ value of 66 pm/V. By alloying with an appropriate amount of Tellurium as espoused in the present invention and as discussed in example 6 below, the birefringence can be tuned to a near ideal value for a given application that best uses the intrinsic nonlinearity and maximizes the useful length of the crystal.

$AgGaSe_2$ has been studied extensively and is available commercially. Table V below shows parameters for a three term Sellmeier Expression for $AgGaSe_2$ as disclosed in the published article of G. C. Bhar appearing in the journal Applied Optics at volume 15, page 305 (1976). Similar values and additional details also appear in table 2.1 of Chapter 2 in the well known reference text "Handbook of Thermo-Optic Coefficients of Optical Materials With Applications" By Gorachand Ghosh published by Academic Press of New York, Boston and San Diego. The technical articles "Crystal Growth and Optical Properties of $AgGaS_2$ and $AgGaSe_2$" by G. G. Catella and David Burlage, "Properties of Dopants in $ZnGeP_2$, CdGeAs2, $AgGaS_2$ and $AgGaSe_2$" by B. H. Bairamov, V. Yu. Rud, and Yu. V. Rud and "Nonlinear Frequency Conversion Performance of $AgGaSe_2$, $ZnGeP_2$ and $CdGeAs_2$" by P. G. Schunemann, K. L. Schlepler and P. A. Budni all appearing in the July 1998 issue of the "MRS Bulletin" (Materials Research Society, Warrendale , Pa., 15086), also provide details regarding the $AgGaSe_2$ material and include extended lists of additional references. Additionally a growth process for $AgGaSe_2$ material is disclosed in the U.S. Pat. Nos. 5,475,526 and 5,355,247 of Robert L. Byer et al., patents which are assigned to The Board of Trustees of the Leland Stanford, Jr. University of Stanford, California.

TABLE V

Parameters for Three Term Sellmeier Expressions for $AgGaSe_2$

| Parameter | $n_e^2$ | $n_o^2$ |
|---|---|---|
| A | 5.2912 | 4.6453 |
| B | 1.397 | 2.2057 |
| C | 0.2845 | 0.1879 |
| D | 1.9282 | 1.8377 |
| E | 1600 | 1600 |

EXAMPLE 3

$AgGaS_2$

A fabrication of the remaining of the two quaternary alloys of present focus, i.e., a fabrication of the $AgGa(S_{(1-x)}Te_x)_2$ sulfide alloy, may also in fact commence with the above disclosed $AgGaTe_2$ ternary chalcopyrite material as a first component and use the ternary $AgGaS_2$ Silver Thiogallate chalcopyrite material as a second component. Alternately this quaternary fabrication can also commence with the four component elements of the quaternary alloy. In either of these instances, the horizontal pulling method disclosed in the above identified U.S. Pat. No. 5,611,856 is also deemed an appropriate alloy fabrication process. In view of the former or ternary alloy possible origination of the quaternary alloys, a discussion of the ternary alloy, $AgGaS_2$, component as a part of the "closely related materials" disclosure again appears appropriate. The present Example 3 is used for this second quaternary from second ternary alloy discussion purpose.

Several of the previously referred-to drawings in the present patent document are also either generally or specifically descriptive of this present second quaternary from second ternary alloy example. The FIG. 1, FIG. 4 and FIG. 5 use drawings are of course relevant to this alloy discussion from both the end use and component use of $AgGaS_2$ viewpoints. The crystal structure shown in FIG. 3 and the birefringence properties discussed in connection with FIGS. 6 and 7 also have relevance to a $AgGaS_2$ discussion. Generally the substitution of Sulfur for Selenium in chalcopyrite alloys has the effect of changing the favored portion of the electromagnetic spectrum for the material. The presence of Sulfur in lieu of Selenium with respect to the $AgGa(S_{(1-x)}Te_x)_2$ and $AgGa(Se_{(1-x)}Te_x)_2$ quaternary materials for example has the effect of shifting the crystal usable wavelength band slightly toward the visible region.

A plurality of additional properties of the ternary, $AgGaS_2$, alloy are also disclosed in the above referred-to Springer-Verlag handbook of optical materials, see especially section 3.1.21, the seven other references to this material (some of multiple pages length) in the "subject index" of the Springer-Verlag handbook and the "references" disclosed commencing at page 197 of the 1991 handbook text. Further properties of the $AgGaS_2$ material and its growth are to be found in articles appearing in the above identified "MRS Bulletin", Volume 23 number 7, July 1998 and in the publications identified in these articles. One of these articles "Crystal Growth and Optical Properties of $AgGaS_2$ and $AgGaSe_2$" by G. C. Catella and D. Burlage appearing at page 28 has been referred-to above and appears especially relevant. Notably the $AgGaSe_2$ alloy also provides negative birefringence characteristics and is therefore a desirable end use or component material in present invention wavelength changing crystals. Additional data regarding characteristics of the $AgGaS_2$ alloy, including the source data of the FIG. 7 curve for this alloy, are available from the work of Boyd et al. as identified in example 2 above.

By way of concluding the present example 3, the conversion efficiency for $AgGaS_2$ is also limited as neither its birefringence nor its non-linear properties are optimal for such service. This results in a phase matching angle which does not use effectively the available nonlinearity, causes excessive walk-off of the signal and pump beams and provides a low conversion efficiency in view of its low $\chi^2$ value of 22 pm/V. By alloying with an appropriate amount of Tellurium as espoused herein, the birefringence can be tuned to the ideal value for a given application that best uses the intrinsic nonlinearity and maximizes the useful length of the crystal. Again Te additions have not previously been exploited as, strangely, Tellurium has been largely overlooked in comparison to the similar elements Indium, Selenium and Sulfur whose compounds are available commercially.

$AgGaS_2$ has also been studied extensively and is available commercially. Table VI below shows parameters for a three term Sellmeier Expression for $AgGaS_2$. These values also appear in the published article of G. C. Bhar in the Journal Applied Optics at volume 15, page 305 (1976). Similar values and additional details also appear in the table 2.1 of Chapter 2 in the above identified and familiar "Handbook of Thermo-Optic Coefficients of Optical Materials With Applications" text by Gorachand Ghosh published by Academic Press of New York, Boston and San Diego.

TABLE VI

Parameters for Three Term Sellmeier Expressions for $AgGaS_2$

| Parameter | $n_e^2$ | $n_o^2$ |
| --- | --- | --- |
| A | 4.0172 | 3.6280 |
| B | 1.527 | 2.1686 |
| C | 0.1310 | 0.1003 |
| D | 2.1699 | 2.1753 |
| E | 950 | 950 |

EXAMPLE 4

$AgInSe_2$

It is of course possible to achieve birefringence and phase matching operation in mixed crystals of the types focused-upon in the present invention i.e., through use of the quaternary materials $AgGa(Se_{(1-x)}Te_x)_2$ and $AgGa(S_{(1-x)}Te_x)_2$ where x is chosen to provide the desired room temperature birefringence. One example relevant to this quaternary material approach to birefringence and phase matched operation and employing the related indium cation quaternary material, $Ag(Ga_xIn_{(1-x)})Se_2$, a material whose properties are currently known, is considered in Example 5 disclosed later herein. In the present example 4 another indium inclusive material, a material usable as a fabrication component of the example 5 $AgGa_xIn_{(1-x)})Se_2$ material is considered. The $AgInSe_2$ material of present consideration has inadequate birefringence as a ternary material for use in a wavelength conversion process and is of primary interest as the cation component of the quaternary Indium material. Other properties of this present example $AgInSe_2$ material are also known including indices values which are reported in the Institute of Electrical and Electronic Engineers Journal of Quantum Electronics, volume QE8, page 900 (1972) authored by C. D. Boyd, H. M. Kasper, J. H. McFee and F. G. Storz.

Several of the previously discussed drawings in the present patent document are also either generally or specifically descriptive of this $AgInSe_2$ cation alloy. The FIG. 1, FIG. 4 and FIG. 5 laser device utilization drawings are of course relevant to this alloy in its incorporated as a component usage. The crystal structure shown in FIG. 3 has relevance to the $AgInSe_2$ alloy and the birefringence properties disclosed in FIG. 7 include a curve descriptive of this material. Generally a presence of the element Indium in a chalcopyrite crystal results in modification of the cation lattice of the crystal and some alteration of the non cation included material crystal properties. In the present instance such a modification of the cation lattice with Indium reduces the bandgap of the material, increases its nonlinear properties and tunes its birefringence to attain non critical phase matching. The use of Indium cation material in a chalcopyrite crystal is, however, generally less effective in achieving a given degree of characteristic modification than is use of an anion material such as the Tellurium espoused in the present invention; for this reason larger values of x in the chemical formula are generally appropriate for a cation material than for an anion material.

$AgInSe_2$ is positively birefringent for all wavelengths, however, the magnitude of this birefringence b is too small to be useful for phase matching operation of a nonlinear laser device; this birefringence is in fact about one fourth of that for the example 1 $AgGaTe_2$ material. The positive birefringence of course also precludes non critical phase matching and beam walk off free operation in such a laser device. Additional data regarding characteristics of the $AgInSe_2$ alloy, including the source data of the FIG. 7 curve for this alloy, are available from the work of Boyd et al. identified in example 1.

$AgInSe_2$ has also been studied extensively and is available commercially. Table VII below shows parameters for a three term Sellmeier Expression for $AgInSe_2$. Sellmeier values and additional details relating to $AgInSe_2$ also appear in the table 2.1 of Chapter 2 in the above identified and familiar "Handbook of Thermo-Optic Coefficients of Optical Materials With Applications" text by Gorachand Ghosh published by Academic Press of New York, Boston and San Diego.

TABLE VII

Parameters for Three Term Sellmeier Expressions for AgInSe$_2$

| Parameter | $n_e^2$ | $n_o^2$ |
|---|---|---|
| A | 5.7110545 | 5.5429671 |
| B | 1.2818184 | 1.4313841 |
| C | 0.5574472 | 0.4543274 |
| D | 0.7787102 | 0.7787102 |
| E | 900 | 900 |

EXAMPLE 5
AgGa$_{(1-x)}$In$_x$Se$_2$

In a technical article appearing in Applied Physics Letters 63, 1316 (1993) G. C. Bhar, S. Das, U. Chattergee, P. K. Datta, and Yu. M. Andreev disclose work with the quaternary Indium chalcopyrite alloy AgGa$_{(1-x)}$InXSe$_2$ and use of this material as a nonlinear optical crystal. This work, moreover, includes noncritical phase matching applications in the infrared wavelength range of 0.8 to 13 microns and use of the material in second harmonic generation and optical parametric oscillation applications employing the 10.6 micron carbon dioxide line. Indium contents in the range of thirty to forty percent are included in this work. This quaternary Indium alloy is reported in this work to have good properties including strong nonlinear coupling, wide transmission range, wide phase matching range and low energy absorption characteristics. There appears, however, some question as to the commercial availability of this material in sufficient quality and quantity to support its extensive use at the time of present document preparation.

Additionally U. Simon, F. K. Tittle and L. Goldberg, in work reported in the periodical Optical Letters 18 (1993) at page 1931, have determined accurate refractive index data for the AgGa$_{(1-x)}$In$_x$Se$_2$ chalcopyrite crystal; this work is based on crystals of sufficient size and quality having been made available from the former Soviet Union.

The optical properties of the AgGa$_{(1-x)}$In$_x$Se$_2$ chalcopyrite material, at least such properties as are enabling of its use in nonlinear applications relating to the present invention, may additionally be ascertained by way of prediction from the properties of two component alloys, the alloys AgGaSe$_2$ and AgGaIn$_2$. The design Sellmeier equation values are conveniently obtained from the Sellmeier values for the two component alloys. A Commercial source of the AgGa$_{(1-x)}$In$_x$Se$_2$ material is Cleveland Crystal Company.

The AgGa$_{(1-x)}$In$_x$Se$_2$ material is of interest with respect to the Silver Gallium Sulfide Telluride, AgGa(S$_{(1-x)}$Te$_x$)$_2$ and Silver Gallium Selenide Telluride, AgGa(Se$_{(1-x)}$Te$_x$)$_2$ materials of present focus because of its being an early quaternary chalcopyrite material that is presently characterized, because of its somewhat predictable cation/anion differences with respect to the Tellurium quaternary materials and because it in itself offers advancement of the nonlinear crystal laser device art over previously used materials.

EXAMPLE 6
AgGa(Se$_{(1-x)}$Te$_x$)2

The preceding examples provide "closely related material" disclosure believed relevant to the Silver Gallium Selenide Telluride, AgGa(Se$_{(1-x)}$Te$_x$)$_2$ and Silver Gallium Sulfide Telluride, AgGa(S$_{(1-x)}$Te$_x$)$_2$ quaternary alloys of principle focus in the present document. These examples have, among other things, disclosed characteristics of ternary materials usable as parent components for fabricating such quaternary alloys of present document focus. Concurrently these examples also disclose detailed characteristics of parent ternary materials from which quantitative accurate characteristic predictions for the fabricated quaternary alloy can be made. The present example provides specific additional details regarding one of the focused-upon quaternary alloys, the alloy Silver Gallium Selenide Telluride, AgGa (Se$_{(1-x)}$Te$_x$)$_2$.

Motivation for this approach to the AgGa(Se$_{(1-x)}$Te$_x$)$_2$ alloy is provided by the fact that it is possible to achieve phase matching operation in mixed crystals of AgGa(Se$_{(1-x)}$Te$_x$)$_2$, for example, when the material component, x, is chosen to provide the desired room temperature birefringence. Evidence of this phase matching operation is provided by the related Silver Gallium Indium Selenide, AgGa$_{(1-x)}$In$_x$Se$_2$ quaternary alloy considered in example 5 above. In the focused-upon Tellurium quaternary materials AgGa (Se$_{(1-x)}$Te$_x$)$_2$ and AgGa(Te$_x$S$_{(1-x)}$Te$_x$)$_2$, however, the adding of Tellurium anions has several benefits over the more traditional example 5 approach of adding Indium cations to a ternary alloy. For example, introducing an anion into a crystal lattice avoids introducing disorder into the characteristic-determining cation sublattice. Also, the added Tellurium ions are more efficient than Indium ions in changing the birefringence; therefore substantially smaller x-values are required.

As has been indicated previously herein fabrication of the quaternary Silver Gallium Selenide Telluride, AgGa(Se$_{(1-x)}$Te$_x$)$_2$ alloy can commence with the two ternary alloys AgGaSe$_2$ and AgGaTe$_2$ and characteristics including Sellmeier equations for these two alloys are disclosed either directly for the AgGaTe$_2$ parent or by reference for the AgGaSe$_2$ parent above. As also noted previously applicants believe they are the first to characterize the AgGaTe$_2$ parent material in this detail since sufficient quantities in necessary quality form were heretofore unavailable and have only recently become available to applicants.

The indices of refraction for negatively birefringent mixed crystals of materials such as the AgGa(Se$_{(1-x)}$Te$_x$)$_2$ of present example consideration for various value of x can be calculated by two different models. Both models have been used separately by writers in the literature and the methods provide the same result. The Sellmeier expressions given by equations 13 and 14 for one parent alloy, AgGaTe$_2$, and the best set of Sellmeier expressions for AgGaSe$_2$ as disclosed by G. C. Bhar in the journal Applied Optics at volume 15, page 305 (1976) or alternately from Table V above provide the indices of the other parent ternary alloy compound in the present instance. In one model, the indices of the mixed crystal AgGa(Se$_{(1-x)}$Te$_x$)$_2$ are taken as a weighted average of those of its parents AgGaSe$_2$ and AgGaTe$_2$. In the other model, the Sellmeier coefficients for the mixed crystal are taken as a weighted average of those of its parents AgGaSe$_2$ and AgGaTe$_2$ using the weighting factors of (1×x) and x respectively. FIG. 2 in the drawings displays the predicted phase matching angles for the negatively birefringent material AgGa(Se$_{(1-x)}$Te$_x$)$_2$ as the Te concentration varies from 0–30%.

Equations 15 and 16 provide respectively, quantitative expressions for the effective NLO coefficient, $(\chi_{36}^{(2)})_{eff}$, and for the wavelength conversion efficiency for the AgGa(Se$_{(1-x)}$Te$_x$)$_2$ case of negative birefringence, a Type I SHG/OPO process, and a chalcopyrite using the usual notation and for the standard geometry.

$$(\chi_{36}^{(2)})_{eff} = (\chi_{36}^{(2)}) \sin \theta \quad (15)$$

Conversion efficiency is proportional to: $(\chi_{36}^{(2)} \sin \theta)^2/n^3$ (16)

Non-critical phase matching occurs for a phase matching angle θ=90 degrees. For this condition the maximum utilization of the available nonlinear properties of the AgGa(Se$_{(1-x)}$Te$_x$)$_2$ crystal is possible as sin θ has its maximum value and therefore equation 16 predicts favorable efficiency.

FIG. 2 in the drawings therefore shows a room temperature nomograph family of curves relating output wavelength, phase matching angle and Tellurium content for a Silver Gallium Selenide Telluride, AgGa(Te$_x$Se$_{(100-x)}$)$_2$ chalcopyrite nonlinear optical material. With the experimentally obtained curves of FIG. 2 it is possible to select a set of operating conditions enabling a particular input to output wavelength relationship for a chalcopyrite crystal of selected composition. Use of the FIG. 2 curves in this manner is perhaps best explained with the aid of an example. An example involving the 10.6 micron spectral line of the carbon dioxide pump laser depicted at 104 in FIG. 1, and represented by the line 200 in FIG. 2, may be used for this purpose.

From the labeling associated with the lower scale 202 and the line 200 in the FIG. 2 drawing it can be appreciated that the line 200 represents a second harmonic generation (SHG) and wavelength division-by-two operating condition for a laser device. As a result of these conditions the 10.6 micron input wavelength of the pump laser 104 in FIG. 1 is divided by two and output energy of 5.3 micron wavelength is being sought-after in the FIG. 2 example. Once these input and output wavelength relationships have been determined, use the FIG. 2 curves involves ascertaining the percentage of Tellurium content for the optically nonlinear alloy of the crystal 110 in FIG. 1 using the upper FIG. 2 scale at 208. From this scale it is determined that a crystal having about fourteen percent Tellurium content (i.e., eighty six percent of maximum Selenium content and fourteen percent of maximum Tellurium content of an AgGaSe$_2$ or an AgGaTe$_2$ crystal) provides a range of possible phase matching angles θ, along the angle scale 204, usable in the laser device under consideration. In making a selection from these possible phase matching angles a choice of angles between about sixty degrees and ninety degrees is available. It is, of course, usually desirable to consider that a large phase matching angle corresponds with highest conversion efficiency in selecting an operating point in this range. The relationship between phase matching angle and conversion efficiency is predicted by several of the equations appearing above including equations 4, 5, 8, 9, 15 and 16.

From a slightly different perspective the FIG. 2 curves demonstrate that with addition of the element Tellurium to the ternary alloy AgGaSe$_2$ it is possible to operate within a range of wavelengths along the scale 202 that are useful in infrared optical parametric oscillation and second harmonic generation devices. For example, so long as an output wavelength below 6.3 microns is needed and pure AgGaSe$_2$ is used in the nonlinear crystal, laser device operation is limited to locations along the zero percent Tellurium curve 212 and the only accessible phase matching angles along scale 204 are angles well below the high efficiency, near ninety degree angles. If operation at an output wavelength of four microns is desired the FIG. 2 curves indicate that some Tellurium content is needed if phase matching angles better than the forty to forty five degree range are to be achieved.

Clearly operation of a wavelength changing device nonlinear crystal in the region 210 of the FIG. 2 curves is desirable and the possibility of such operation with its favorable energy conversion efficiency and within a desirable four microns to six microns range of output wavelengths is significantly enhanced by the addition of Tellurium to the ternary alloy AgGaSe$_2$. The FIG. 2 nomograph may of course be used to select the Tellurium content of a Silver Gallium Sulfide Telluride crystal operative at other phase matching angles than those of the region 210 if other properties of the crystal or laser device physical limitations for examples make the ninety degree phase matching angle undesirable.

Curve families of the FIG. 2 type may of course be developed for operating temperatures other than the room temperature represented in FIG. 2. Similarly curves of the FIG. 2 type may be developed for other chalcopyrite alloys including the Silver Gallium Sulfide Telluride, AgGa(S$_{(1-x)}$Te$_x$)$_2$ alloy of focus in the present invention.

Room temperature wavelength versus refraction index curves for the AgGaTe$_2$ material, are shown in FIG. 11a of the drawings herein. These curves relate somewhat to the FIG. 2 AgGa(Se$_{(1-x)}$Te$_x$)$_2$ curves in a before and after sense. The disadvantage of the AgGaTe$_2$ material for present purposes that is apparent in FIG. 11a curves, because second harmonic generation operation is not possible at the wavelength of the 10.6 micron carbon dioxide laser line, is corrected through addition of a near optimum amount of Tellurium to form the present example quaternary alloy Silver Gallium Selenide Telluride represented in FIG. 11b. This formation of the quaternary material has also changed the applicable index of refraction and the spacing between the illustrated ordinary and extraordinary refraction index curves. The illustrated lower value refraction index, as indicated in FIG. 11a, is a value supporting second harmonic generation use with the 10.6 micron line.

From the equations 4, 5, 8, 9, 15 and 16 it is also possible to appreciate the benefits of Tellurium addition to a AgGaSe$_2$ alloy in terms of the achieved conversion efficiency. The relative conversion efficiency for AgGa(Se$_{(1-x)}$Te$_x$)$_2$ normalized to that of AgGaSe$_2$ for 18% Te is found to be 1.84. As the band gap for this material is estimated to be 1.74 electron volt as compared to a value of 1.83 electron volt for AgGaSe$_2$ and as $\chi^{(2)}$ is known to increase as $1/Eg^{4.2}$ (see A. G. Jackson, M. C. Ohmer, S. R. Leclair, Infrared Physics & Technology, 38, 233 (1997)) its $\chi^{(2)}$ is estimated to be 24% larger or 82 pm/V. As a result, the conversion efficiency for this composition is predicted to exceed that of the AgGaSe$_2$ by a factor of 2.3.

The preceding example may be better understood by continuing the line of thought suggested in the AgGaSe$_2$ example disclosed above and considering that the phase matching angle for AgGaSe$_2$ is 54.4 degrees for a 10.6 micrometers pump and its $\chi_{36}^{(2)}$ is 66 pm/V; these values are reported in the Springer-Verlag Handbook of Nonlinear Optical Crystals. This angle of 54.4 degrees is however considerably smaller than the ideal phase matching angle of 90 degrees. The value of the angle θ for a 19 percent Tellurium addition to this AgGaSe$_2$ is, however, 86.2 degrees. The figure of merit for conversion efficiency for the 19 percent Tellurium composition is found to be a factor of 1.5 greater than that of AgGaSe$_2$, considering only the larger angle θ; its $\chi_{36}^{(2)}$ is also larger as it has a smaller band gap. The bandgap for an x value of 19 percent is estimated to be 1.74 electron volts as compared to a value of 1.83 electron volts for AgGaSe$_2$. As $\chi_{36}^{(2)}$ increases approximately as $1/Eg^{4.2}$, its $\chi_{36}^{(2)}$ is estimate be 82 pm/V. As a result, the conversion efficiency for this composition is predicted to exceed that of the AgGaSe$_2$ by a factor of 2.3 for a 10.6 micrometers second harmonic generation. This estimate neglects the additional improvement resulting from a factor of ten reduction in the walk-off angle.

Therefore although AgGaTe$_2$ will not phase match at room temperature mixed crystals of the form AgGa(Se$_{(1-x)}$)

Te$_x$)$_2$ for Te additions in the 10–20% range can exceed the conversion efficiency of AgGaSe$_2$ significantly. In addition such a tuned quaternary alloy enables noncritical phase match operation of the laser device including use of a phase match angle supporting optimum use of the material's nonlinear properties, maximized useful length of the available crystal, room temperature wavelength changing operation, significantly increased second order nonlinear susceptibility, a factor of ten reduction in the walk-off angle and photon energy conversion efficiencies several times those usually achieved. The Tellurium alloy component also accomplishes shifting of the semiconductor material energy absorption characteristic to avoid a preferred laser pump wavelength energy absorption peak and assists in circumvention of the thermal lensing phenomenon in the crystal. The accomplished laser device provides infrared energy output while operating in for example either the second harmonic generation or the optical parametric oscillation configurations. Relatively small additions of Te to the present state of the art AgGaSe$_2$ material improve conversion efficiencies significantly.

The addition of Tellurium to nonlinear optical materials is believed therefore to provide a significant advance in the nonlinear optical and laser device arts.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. The chalcopyrite single crystal nonlinear optical material of chemical formulation AgGa(Se$_{(1-x)}$Te$_x$)$_2$ wherein x represents a fractional value between two one hundredths and ninety eight one hundredths.

2. The chemical formulation AgGa(Se$_{(1-x)}$Te$_x$)$_2$ chalcopyrite single crystal nonlinear optical material of claim 1 wherein x represents a fractional value between two one hundredths and thirty one hundredths.

3. The chemical formulation AgGa(Se$_{(1-x)}$Te$_x$)$_2$ chalcopyrite single crystal nonlinear optical material of claim 2 wherein x represents a fractional value between ten one hundredths and twenty one hundredths.

4. The chalcopyrite single crystal nonlinear optical material of chemical formulation AgGa(S$_{(1-x)}$Te$_x$)$_2$ wherein x represents a fractional value between two one hundredths and ninety eight one hundredths.

5. The chemical formulation AgGa(S$_{(1-x)}$Te$_x$)$_2$ chalcopyrite single crystal nonlinear optical material of claim 4 wherein x represents a fractional value between two one hundredths and thirty one hundredths.

6. The chemical formulation AgGa(S$_{(1-x)}$Te$_x$)$_2$ chalcopyrite single crystal nonlinear optical material of claim 5 wherein x represents a fractional value between ten one hundredths and twenty one hundredths.

7. A composition of matter comprising a Silver and Tellurium-inclusive quaternary chalcopyrite crystal wherein said quaternary chalcopyrite crystal is a nonlinear optical crystal further comprising the element Gallium and one of the elements of Selenium and Sulfur.

8. The composition of matter of claim 7 wherein said Tellurium-inclusive quaternary chalcopyrite nonlinear optical crystal includes a Tellurium content between one and thirty percent.

9. A composition of matter consisting of a Gallium and Tellurium-inclusive quaternary chalcopyrite crystal wherein said Tellurium-inclusive quaternary chalcopyrite is a nonlinear optical crystal consisting of the elements Silver and Gallium and one of the elements of Selenium and Sulfur and has a Tellurium content between one and thirty percent.

10. The single crystal quaternary alloy chalcopyrite semiconductor nonlinear optical material having crystal structure comprising:

a crystalline cubic lattice (304) located at an intersection (306) of 100, 001 and 010 coordinate axes (302, 303, 305) said lattice (304) having lattice initial plane faces (308, 310, 312) received in planes defined by each 100-001, 100-010 and 010-001 axis pairs, having sub lattice-defining lattice mid planes (314, 316, 318) distal to and parallel with lattice initial planes (308, 310, 312) respectively and having exterior face planes (320, 322, 324) distal to and parallel with each lattice initial plane (308, 310, 312) and each lattice mid plane (314, 316, 318) when viewed along any of three paths (326, 328, 330) parallel to a 100, 001 and 010 axes, paths orthogonal to 001-010, 100-010, and 100-001 planes respectively;

Gallium atoms (332) located in each sub lattice corner of a lattice mid plane lying along said 100 axis (302) parallel with said 001-010 plane; plus Gallium atoms (334) located at each sub lattice center in the lattice initial and exterior planes (312, 324) lying along said 100 axis (302) commencing at said 001-010 plane; plus Gallium atoms (336) located at sub lattice centers of said initial, said mid and said exterior planes (310, 316, 322) within a first half (337) of said cube lattice (304), a half located parallel to and adjacent said 001-010 plane, along said 100 axis (302); plus Silver atoms (338) located at each sub lattice corner in lattice initial and exterior plane faces (320, 324) disposed along said 100 axis (302) parallel to said 001-010 plane; plus Silver atoms (340) located at sub lattice centers of said initial, said mid and said exterior planes (310, 316, 322) along said 001 axis within a second half (342) of said cube lattice, a half located parallel to and distal of said 001-010 plane along said 100 axis (302); plus differential number-quantity, similarly located, Selenium and Tellurium atoms (343) received in planes intermediate said lattice initial plane, said lattice mid plane and said lattice external plane in mediate planes lying along each of said 100, 001 and 010 axes, said differential number-quantity atoms (343) being disposed in ordered array in random fill anion lattice patterns paralleling each of said 100-010, 100-001, and 010-001 planes.

11. The single crystal quaternary alloy chalcopyrite semiconductor nonlinear optical material having crystal structure comprising:

a crystalline cubic lattice (304) located at an intersection (306) of 100, 001 and 010 coordinate axes (302, 303, 305) said lattice (304) having lattice initial plane faces (308, 310, 312) received in planes defined by each 100-001, 100-010 and 010-001 axis pairs, having sub lattice-defining lattice mid planes (314, 316, 318) distal to and parallel with lattice initial planes (308, 310, 312) respectively and having exterior face planes (320, 322, 324) distal to and parallel with each lattice initial plane (308, 310, 312) and each lattice mid plane (314, 316, 318) when viewed along any of three paths (326, 328, 330) parallel to a 100, 001 and 010 axes, paths orthogonal to 001-010, 100-010, and 100-001 planes respectively;

Gallium atoms (332) located in each sub lattice corner of a lattice mid plane lying along said 100 axis (302) parallel with said 001-010 plane; plus Gallium atoms (334) located at each sub lattice center in the lattice initial and exterior planes (312, 324) lying along said 100 axis (302) commencing at said 001-010 plane; plus Gallium atoms (336) located at sub lattice centers of said initial, said mid and said exterior planes (310, 316, 322) within a first half (337) of said cube lattice (304), a half located parallel to and adjacent said 001-010 plane, along said 100 axis (302); plus Silver atoms (338) located at each sub lattice corner in lattice initial and exterior plane faces (320, 324) disposed along said 100 axis (302) parallel to said 001-010 plane; plus Silver atoms (340) located at sub lattice centers of said initial, said mid and said exterior planes (310, 316, 322) along said 001 axis within a second half (342) of said cube lattice, a half located parallel to and distal of said 001-010 plane along said 100 axis (302); plus differential number-quantity, similarly located, Sulfur and Tellurium atoms (343) received in planes intermediate said lattice initial plane, said lattice mid plane and said lattice external plane in mediate planes lying along each of said 100, 001 and 010 axes, said differential number-quantity atoms (343) being disposed in ordered array in random fill anion lattice patterns paralleling each of said 100-010, 100-001, and 010-001 planes.

12. The nonlinear optical material comprising elements Silver, Gallium, Selenium and Tellurium disposed in a chalcopyrite crystal.

13. The nonlinear optical material comprising elements Silver, Gallium, Selenium and Tellurium of claim 12 wherein said optical material consists essentially of a quaternary chalcopyrite crystal combination of elements Silver, Gallium, Selenium and Tellurium.

14. The nonlinear optical material quaternary chalcopyrite crystal consisting essentially of elements Silver, Gallium, Selenium and Tellurium of claim 13 wherein said material is disposed in single crystal form and wherein atoms of said Tellurium element are located in anion crystal sub lattice locations of said single crystal.

15. The nonlinear optical material quaternary chalcopyrite crystal consisting essentially of elements Silver, Gallium, Selenium and Tellurium of claim 13 wherein said Tellurium atoms are disposed in differential quantity with Selenium atoms in an anion crystal sub lattice.

16. The nonlinear optical material comprising elements Silver, Gallium, Sulfur and Tellurium disposed in a chalcopyrite crystal.

17. The nonlinear optical material chalcopyrite crystal comprising elements Silver, Gallium, Sulfur and Tellurium of claim 16 wherein said optical material consists essentially of a quaternary chalcopyrite crystal combination of elements Silver, Gallium, Sulfur and Tellurium.

18. The nonlinear optical material quaternary chalcopyrite crystal consisting essentially of elements Silver, Gallium, Sulfur and Tellurium of claim 17 wherein said material is disposed in single crystal form and wherein atoms of said Tellurium element are located in anion crystal sub lattice locations of said single crystal.

19. The nonlinear optical material quaternary chalcopyrite crystal consisting essentially of elements Silver, Gallium, Sulfur and Tellurium of claim 17 wherein said Tellurium atoms are disposed in differential quantity with Sulfur atoms in said anion crystal sub lattice.

20. The chemical formulation $AgGa(Se_{(1-x)}Te_x)_2$ chalcopyrite single crystal nonlinear optical material of claim 1 wherein x represents a fractional value of 18 one hundredths (0.18).

21. The chemical formulation $AgGa(S_{(1-x)}Te_x)_2$ chalcopyrite single crystal nonlinear optical material of claim 4 wherein x represents a fractional value of 18 one hundredths (0.18).

22. A composition of matter consisting of Silver and Gallium and Tellurium and one of elements Selenium and Sulfur all disposed in a quaternary chalcopyrite crystal.

23. The composition of matter of claim 22 wherein said composition of matter consists of Silver and Gallium and Tellurium and Selenium all disposed in a quaternary chalcopyrite crystal.

24. The composition of matter of claim 22 wherein said composition of matter consists of Silver and Gallium and Tellurium and Sulfur all disposed in a quaternary chalcopyrite crystal.

25. The nonlinear optical material comprising elements Silver, Gallium, Selenium and Tellurium of claim 12 wherein said optical material consists of a quaternary chalcopyrite crystal combination of elements Silver, Gallium, Selenium and Tellurium.

26. The nonlinear optical material chalcopyrite crystal comprising elements Silver, Gallium, Sulfur and Tellurium of claim 16 wherein said optical material consists of a quaternary chalcopyrite crystal combination of elements Silver, Gallium, Sulfur and Tellurium.

* * * * *